US012812869B2

(12) United States Patent
Lin et al.

(10) Patent No.: US 12,812,869 B2
(45) Date of Patent: Nov. 24, 2026

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Meng-Han Lin, Hsinchu (TW); Chia-En Huang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 470 days.

(21) Appl. No.: 18/153,358

(22) Filed: Jan. 12, 2023

(65) Prior Publication Data

US 2024/0107772 A1 Mar. 28, 2024

Related U.S. Application Data

(60) Provisional application No. 63/376,619, filed on Sep. 22, 2022.

(51) Int. Cl.

| | |
|---|---|
| ***H10B 51/20*** | (2023.01) |
| ***H10B 51/10*** | (2023.01) |
| ***H10D 30/01*** | (2025.01) |
| ***H10D 30/69*** | (2025.01) |
| ***H10W 20/41*** | (2026.01) |

(52) U.S. Cl.
CPC ............. *H10B 51/20* (2023.02); *H10B 51/10* (2023.02); *H10D 30/0415* (2025.01); *H10D 30/701* (2025.01); *H10W 20/435* (2026.01)

(58) Field of Classification Search
CPC ........ H10B 51/10; H10B 51/30; H10B 51/20; H10D 30/0415; H10D 30/701; H10W 20/435
See application file for complete search history.

(56) References Cited

U.S. PATENT DOCUMENTS

2020/0098887 A1* 3/2020 Dewey .................. H10D 84/83
2022/0157833 A1* 5/2022 Kobayashi ........... H10D 64/689
2023/0008261 A1* 1/2023 Sharma ................ H10D 30/701

* cited by examiner

*Primary Examiner* — Suberr L Chi
(74) *Attorney, Agent, or Firm* — WPAT LAW; Anthony King

(57) ABSTRACT

A semiconductor structure is provided. The semiconductor structure includes a gate structure, disposed over a substrate; a ferroelectric material, disposed over the gate structure; a source structure and a drain structure, disposed above the ferroelectric material; an isolation, surrounding the source structure and the drain structure; and an oxide semiconductor, surrounding a portion of the isolation between the source structure and the drain structure. A method of manufacturing the semiconductor structure is also provided.

20 Claims, 28 Drawing Sheets

700

100

101

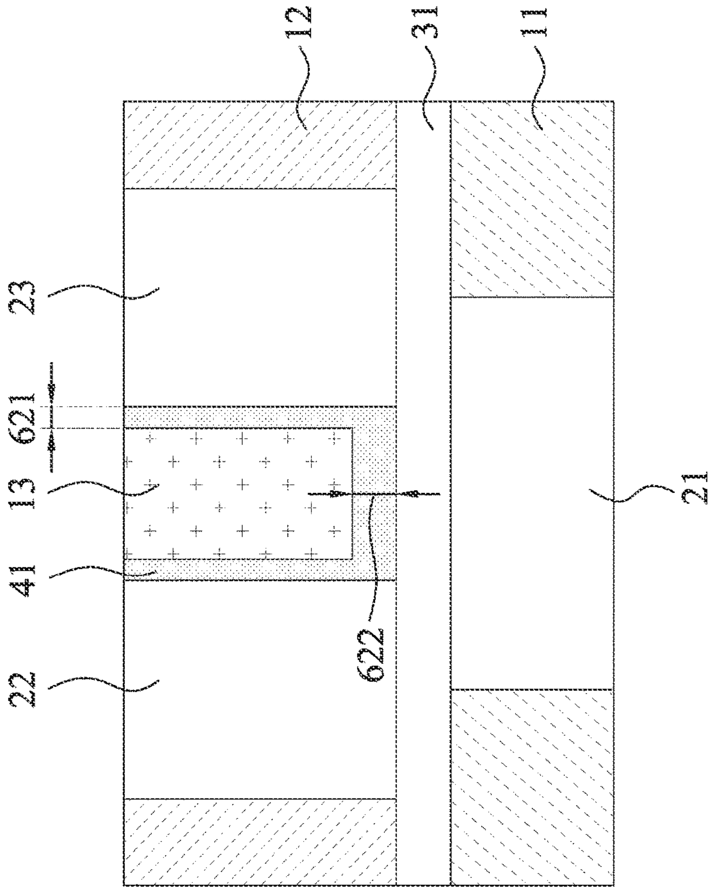
FIG. 11
201
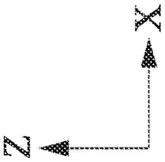

203

206

209

SEMICONDUCTOR STRUCTURE AND METHOD OF MANUFACTURING THE SAME

PRIORITY CLAIM AND CROSS-REFERENCE

This application claims the benefit of prior-filed provisional application No. 63/376,619, filed on 22 Sep. 2022.

BACKGROUND

As the semiconductor industry has progressed into nanometer technology process nodes in pursuit of greater device density, higher performance, and lower costs, there is a need to incorporate and merge logic circuits having a variety of functions with non-volatile memory circuits within one chip. As a non-volatile memory cell, a ferroelectric random-access memory (FeRAM) offers high density, low power consumption, high speed, and low manufacturing cost. One advantage of the FeRAM compared to a static random-access memory (SRAM) and/or a dynamic random-access memory (DRAM) is the FeRAM's significantly smaller size. However, challenges of better control on a switch of the FeRAM while pursuing greater device density have arisen.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

FIGS. 11 to 20 are schematic cross-sectional diagrams of different semiconductor structures in accordance with different embodiments of the present disclosure.

DETAILED DESCRIPTION

Figure 1:
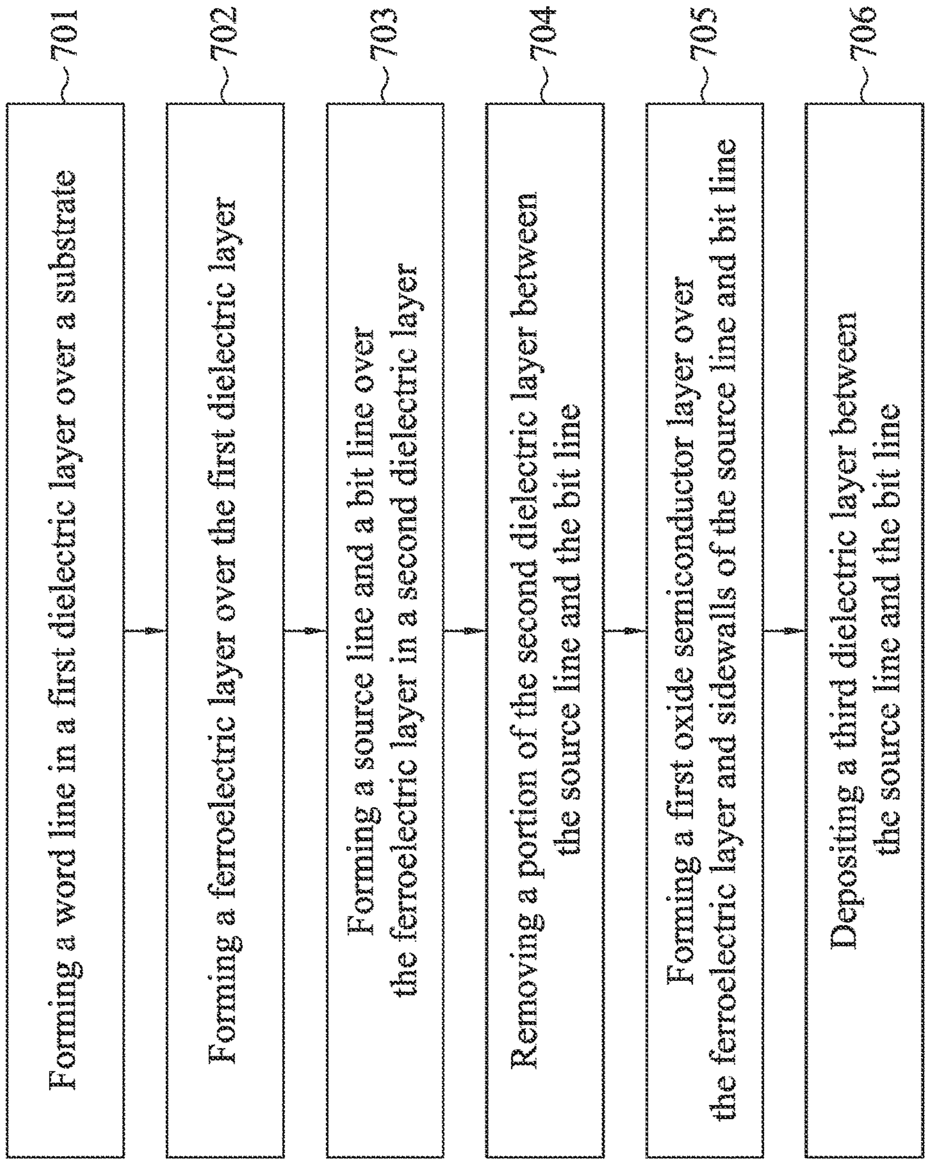
FIG. 1 is a flow diagram of a method 700 for manufacturing a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context. In addition, the term "source/drain region" or "source/drain regions" may refer to a source or a drain, individually or collectively dependent upon the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from normal deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a flow diagram of a method 700 for manufacturing a semiconductor structure in accordance with some embodiments of the present disclosure. The method 700 includes a number of operations (701, 702, 703, 704, 705 and 706) and the description and illustration are not deemed as a limitation to the sequence of the operations. In the operation 701, a word line is formed in a first dielectric layer over a substrate. In the operation 702, a ferroelectric layer is formed over the first dielectric layer. In the operation 703, a source line and a bit line are formed over the ferroelectric layer in a second dielectric layer. In the operation 704, a portion of the second dielectric layer between the source line and the bit line is removed. In the operation 705, a first oxide semiconductor layer is formed over the ferroelectric layer and sidewalls of the source line and bit line. In the operation 706, a third dielectric layer is deposited between the source line and the bit line.

It should be noted that the operations of the method 700 may be rearranged or otherwise modified within the scope of the various aspects. Additional processes may be provided before, during, and after the method 700, and some other processes may be only briefly described herein. Thus, other implementations are possible within the scope of the various aspects described herein.

FIGS. 2A, 2B, 3A, 3B, 4A, 4B, 5A, 5B, 6A, 6B, 7A, 7B, 8A, 8B, 9A and 9B are schematic diagrams of a semiconductor structure at different stages of the method 700 in accordance with some embodiments of the present disclosure, wherein the figures with numerals ending with "A" are schematic three-dimensional (3D) diagrams, and the figures with numerals ending with "B" are schematic cross-sectional diagrams along a line C-C' in the corresponding 3D diagrams.

Figure 2A:
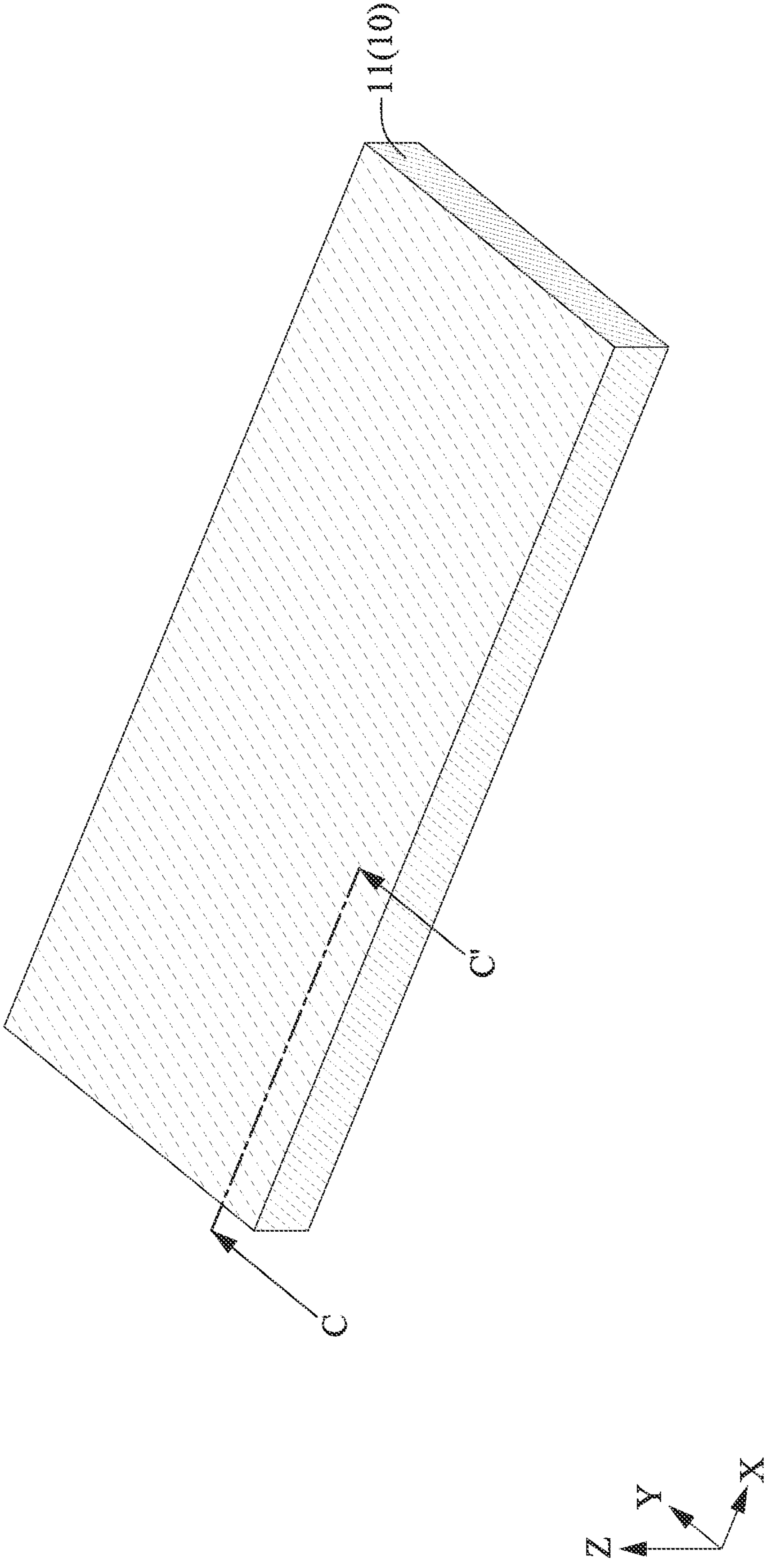
FIGS. 2A, 3A, 4A, 5A, 6A, 7A, 8A, and 9A are schematic three-dimensional (3D) diagrams of a semiconductor structure at different stages of a method in accordance with some embodiments of the present disclosure.
Figure 2B:
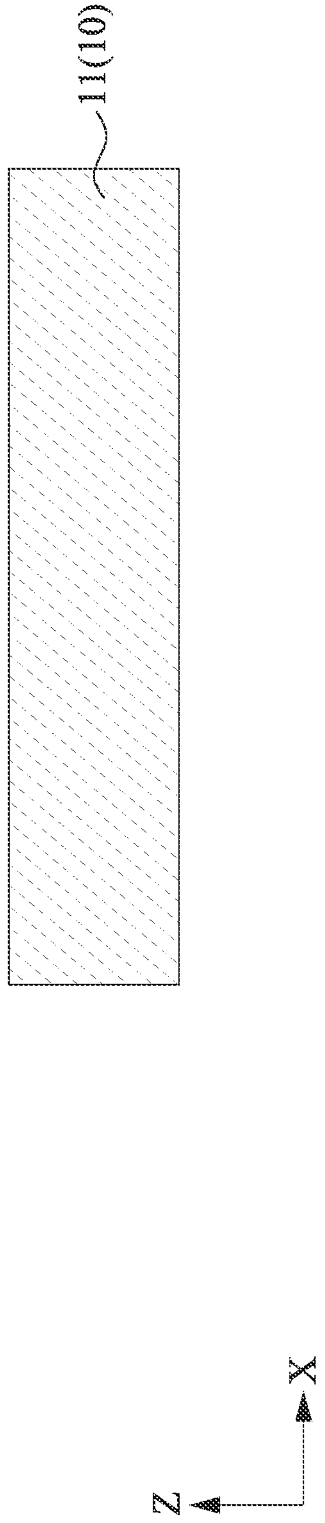
FIGS. 2B, 3B, 4B, 5B, 6B, 7B, 8B, and 9B are schematic cross-sectional diagrams of a semiconductor structure at different stages of a method in accordance with some embodiments of the present disclosure.

Referring to FIGS. 2A and 2B, which are schematic diagrams of a semiconductor structure at a stage of the method 700 in accordance with some embodiments of the present disclosure. In some embodiments, prior to the operation 701, a substrate 10 including a dielectric layer 11 is provided, received, or formed. In some embodiments, the dielectric layer 11 is disposed in an interconnect structure disposed over a logic circuit or a complementary metal-oxide-semiconductor (CMOS) array. In some embodiments, the substrate 10 includes the dielectric layer 11 and all other layers and/or elements disposed below the dielectric layer 11. For a purpose of simplicity of the figures, only a topmost layer (i.e., the dielectric layer 11) of the substrate 10 is shown in the figures. In some embodiments, the dielectric layer 11 is disposed between a fourth metal line layer and a fifth metal line layer of the interconnect structure.

Figure 3A:
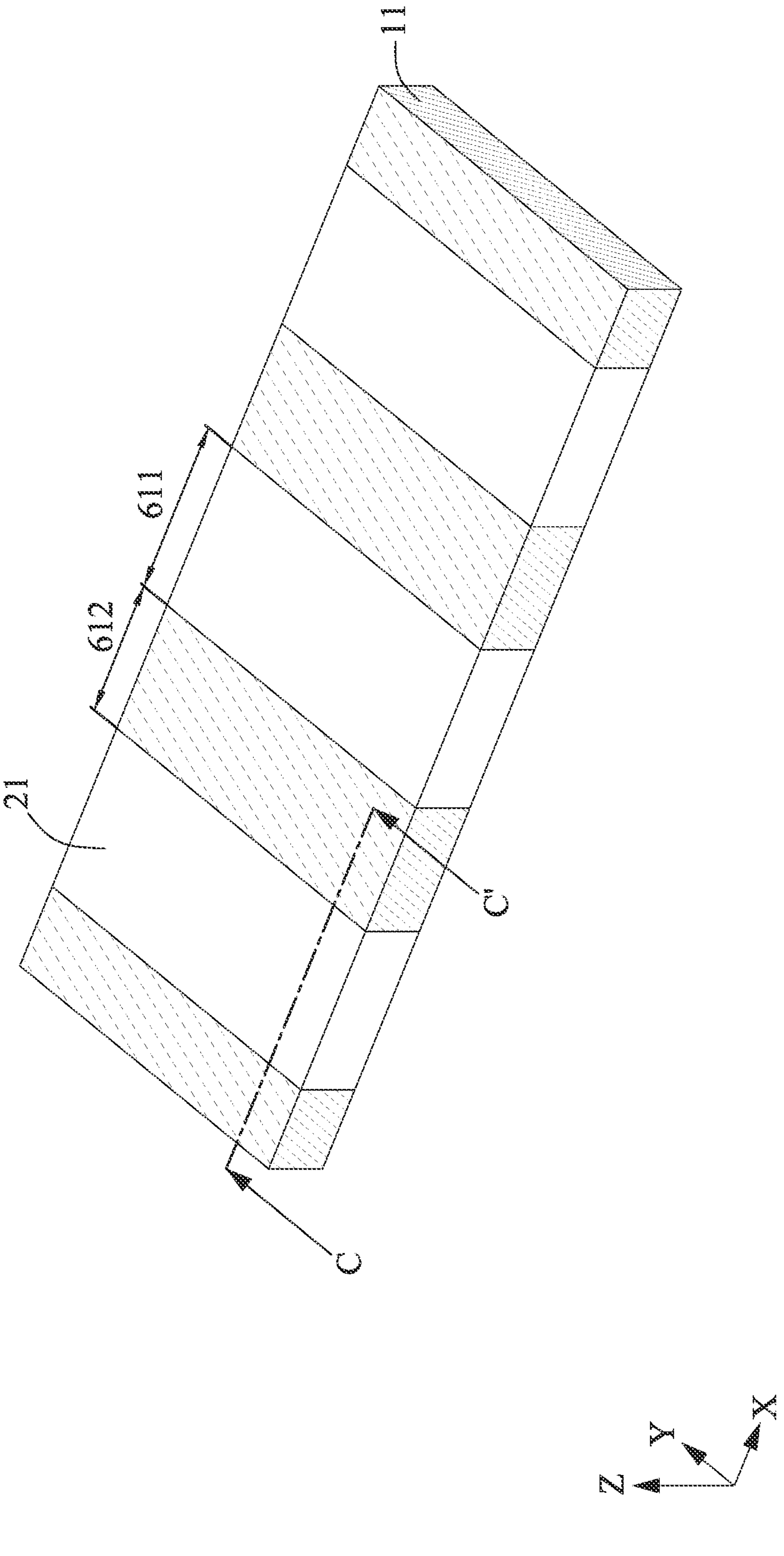
Figure 3B:
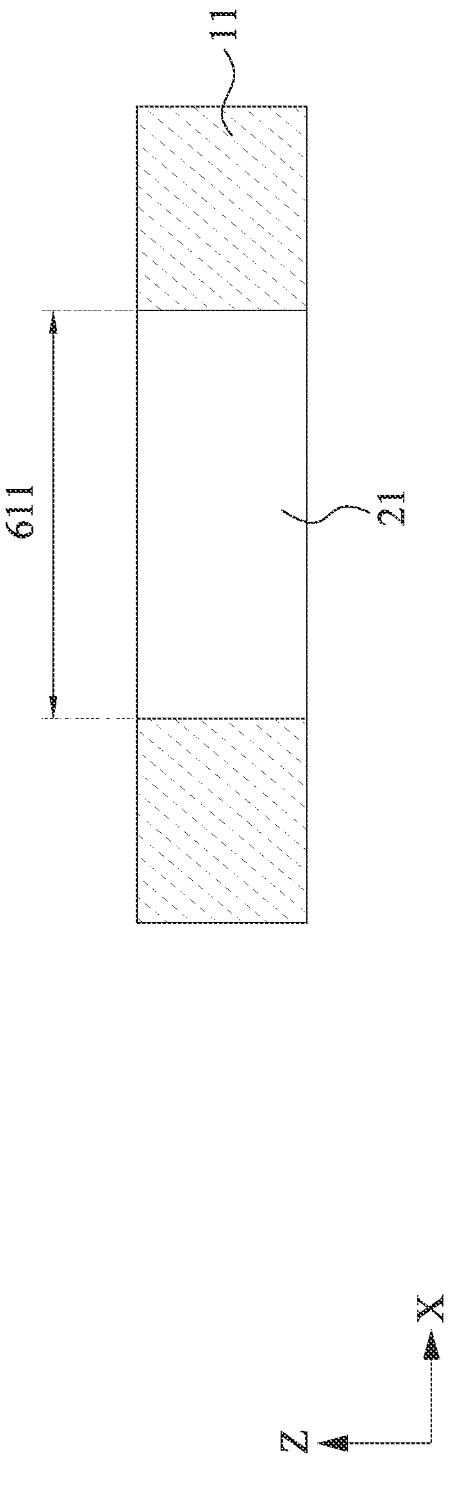

Referring to FIGS. 3A and 3B, which are schematic diagrams of a semiconductor structure at a stage of the method 700 in accordance with some embodiments of the present disclosure. In the operation 701, a plurality of word lines 21 are formed in the dielectric layer 11. In some embodiments, portions of the dielectric layer 11 are removed, and a metallic material is formed in the dielectric layer 11. In some embodiments, the word lines 21 are arranged along a first direction (e.g., X direction), wherein each of the word lines 21 extends along a second direction (e.g., Y direction) substantially orthogonal to the first direction. In some embodiments, a width 611 of the word line 21 is in a range of 30 to 300 nanometers (nm). In some embodiments, the width 611 of the word line 21 is in a range of 40 to 200 nanometers (nm). In some embodiments, a distance 612 between adjacent word lines 21 is in a range of 1 to 100 nm.

Figure 4A:
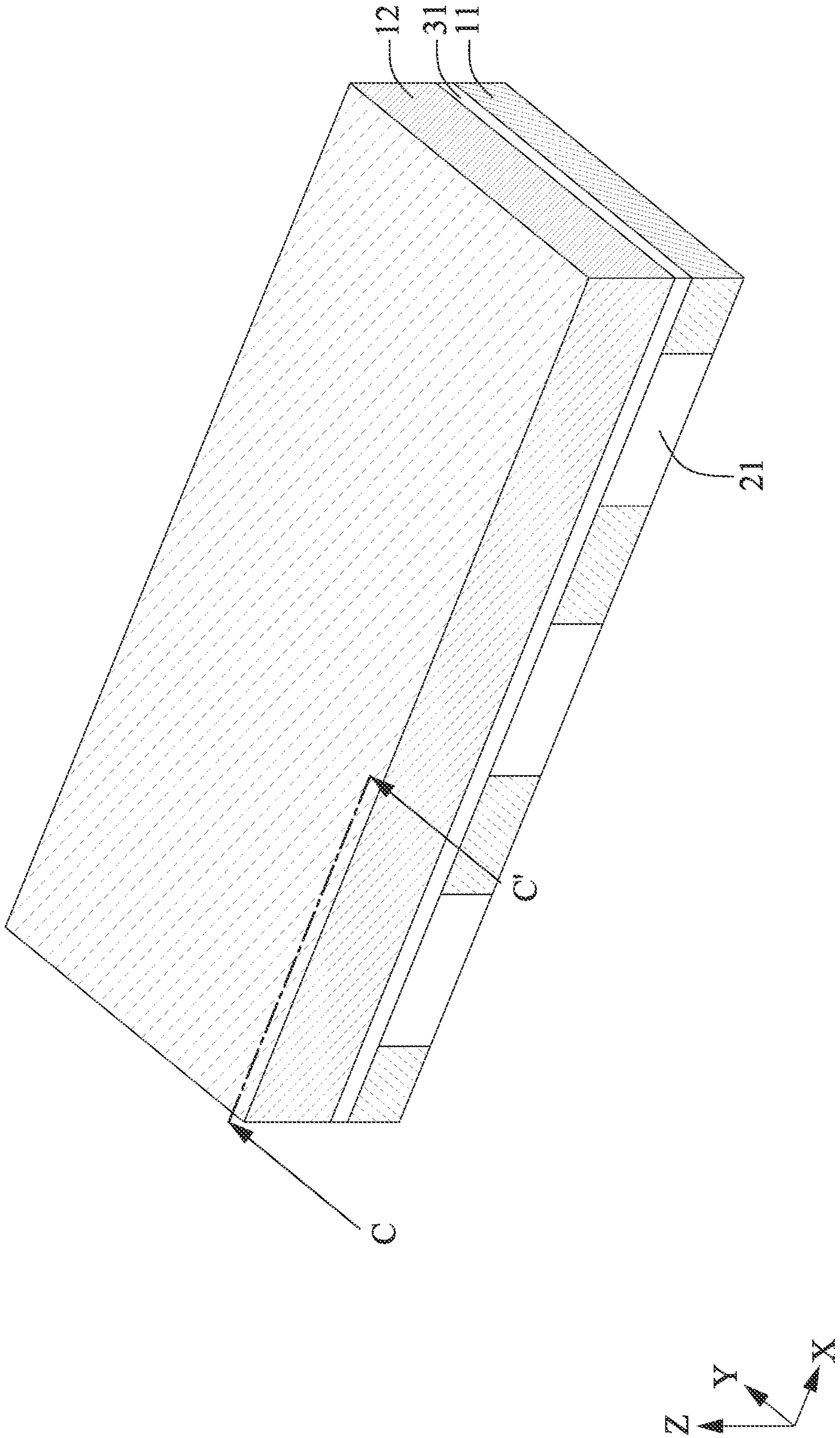
Figure 4B:
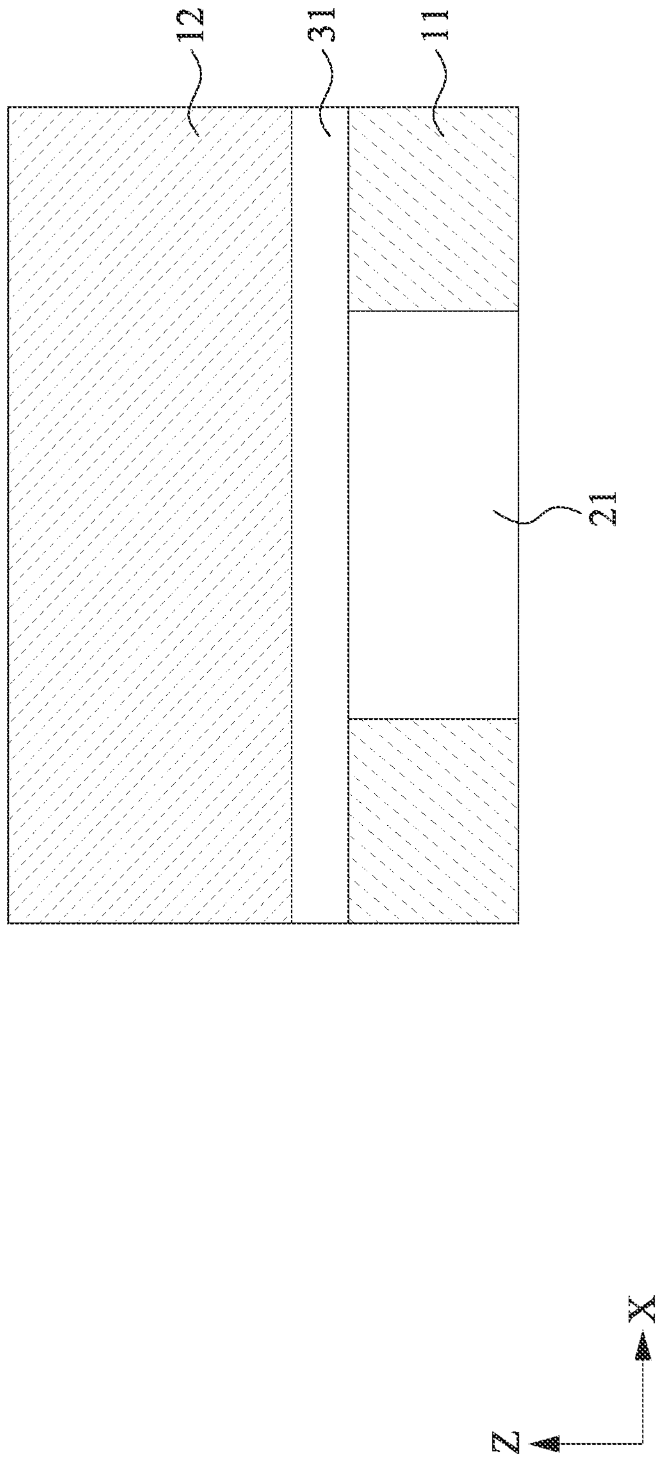

Referring to FIGS. 4A and 4B, which are schematic diagrams of a semiconductor structure at a stage of the method 700 in accordance with some embodiments of the present disclosure. In the operation 702, a ferroelectric layer 31 is formed over the dielectric layer 11 and the word lines 21. In some embodiments, the ferroelectric layer 31 covers an entirety of the word lines 21. In some embodiments, the ferroelectric layer 31 covers an entirety of the dielectric layer 11. In some embodiments, a thickness of the ferroelectric layer 31 is in a range of 1 to 50 nm. After the operation 702, the method 700 may further include formation of a dielectric layer 12 over the ferroelectric layer 31. The dielectric layers 11 and 12 can be made of same of different dielectric materials. In some embodiments, the dielectric material includes oxide, nitride, oxynitride, low-k dielectric materials, high-k dielectric materials, or a combination thereof.

Figure 5A:
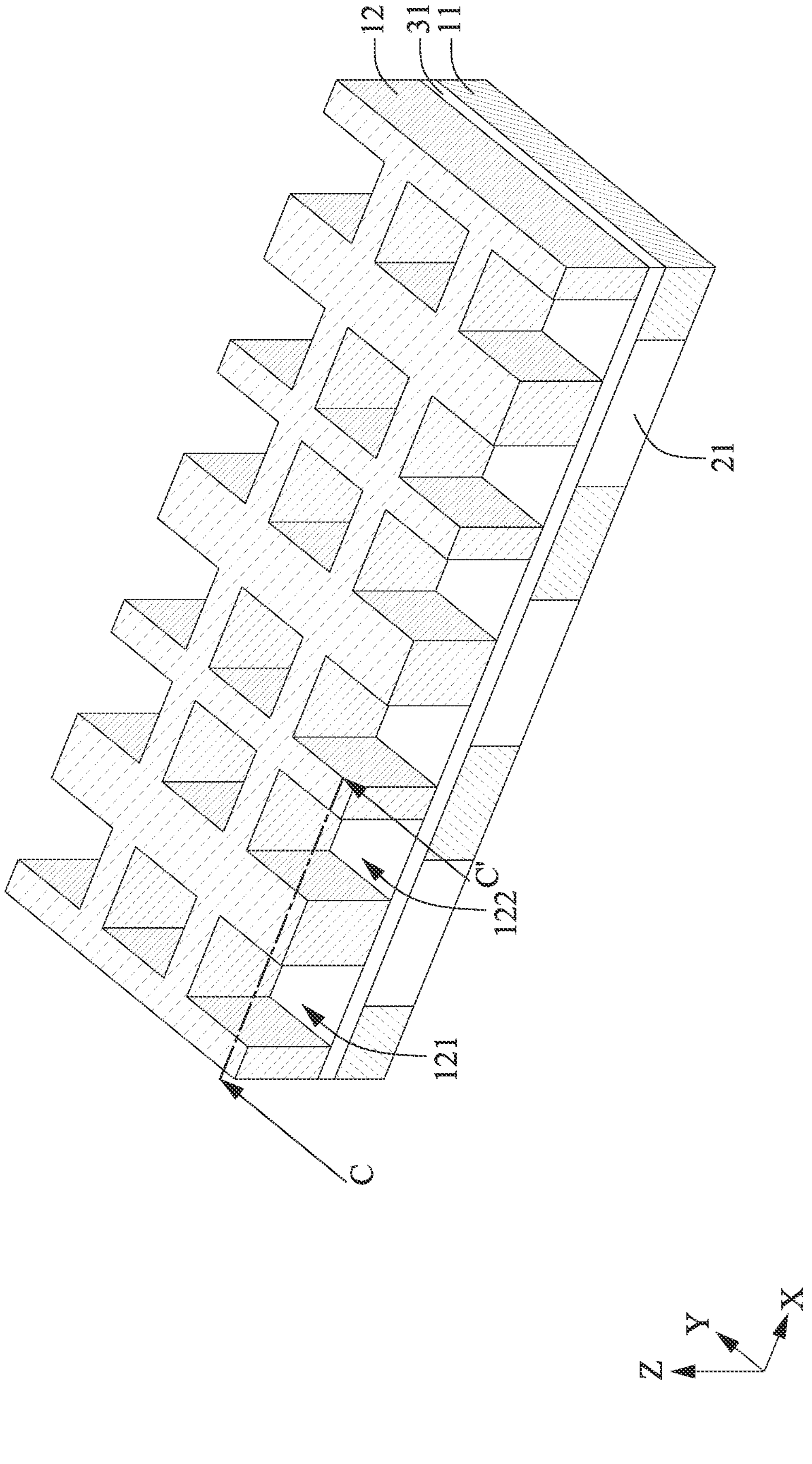
Figure 5B:
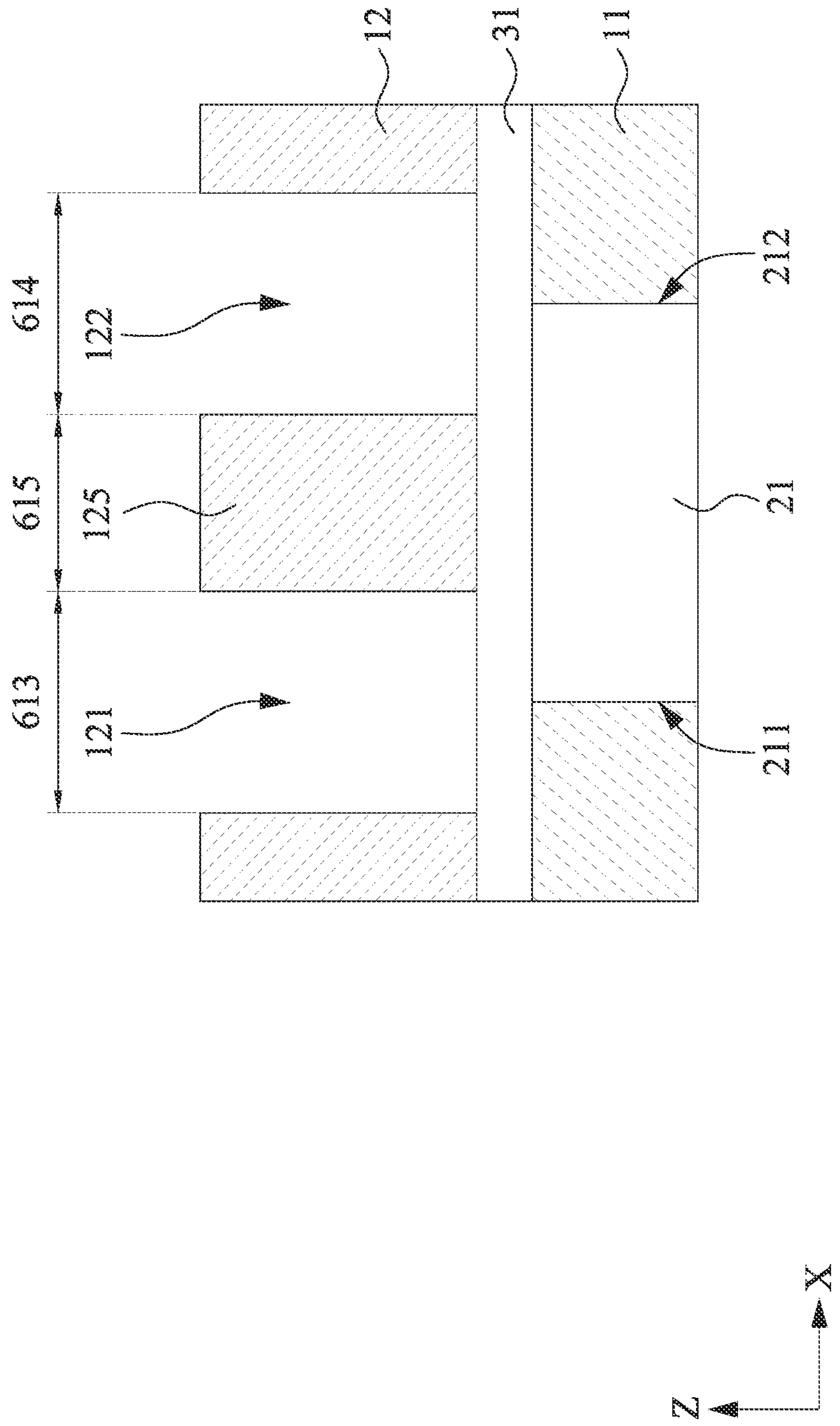

Referring to FIGS. 5A and 5B, which are schematic diagrams of a semiconductor structure at a stage of the method 700 in accordance with some embodiments of the present disclosure. Prior to the operation 703, the method 700 may further include removal of portions of the dielectric layer 12. In some embodiments, the removal of the portions of the dielectric layer 12 includes a lithographic operation and an etching operation. In some embodiments, portions of the dielectric layer 12 that are directly over two opposite peripheries along the first direction are removed. In some embodiments, a first opening 121 over a portion of a first sidewall 211 of the word line 21 is formed by the etching operation. In some embodiments, a second opening 122 over a portion of a second sidewall 212 of the word line 21 is formed by the etching operation, wherein the second sidewall 212 is opposite to the first sidewall 211. In some embodiments, each of the first opening 121 and the second opening 122 may have a rectangular configuration from a top view perspective. In some embodiments, the first opening 121 and the second opening 122 are arranged in a repeating manner along the second direction over a same word line 21. In some embodiments, the first opening 121 and the second opening 122 are arranged in a repeating manner along the first direction (e.g., X direction) over different word lines 21.

In some embodiments, a width 613 of the first opening 121 is substantially equal to a width 614 of the second opening 122 along the first direction. In some embodiments, the width 613 or the width 614 is in a range of 10 to 100 nm. In some embodiments, the first sidewall 211 is substantially aligned with or overlaps a central line of the first opening 121. In some embodiments, the second sidewall 212 is substantially aligned with or overlaps a central line of the second opening 122. In some embodiments, a portion 125 of the dielectric layer 12 remains between the openings 121 and 122 along the first direction. In some embodiments, the portion 125 covers a central region of the word line 21 along the first direction. In some embodiments, a width 615 of the portion 125 along the first direction is in a range of 10 to 100 nm. In some embodiments, the width 615 is about ⅓ of the width 611 of the word line 21 shown in FIG. 3B. In some embodiments, the portion 125 is disposed within a coverage area of the word line 21. In some embodiments, an entirety of the portion 125 is disposed within the coverage area of the word line 21.

Figure 6A:
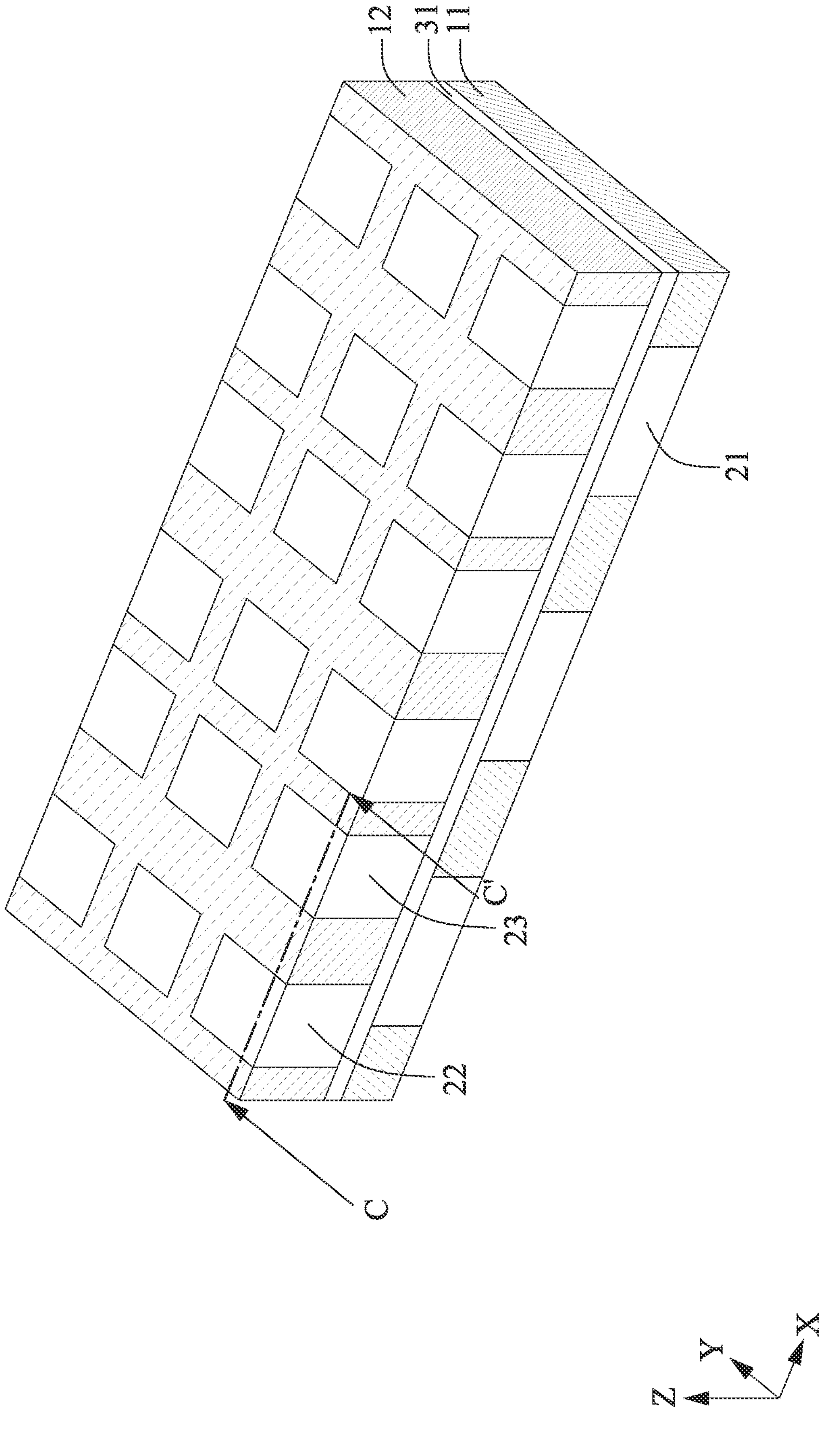
Figure 6B:
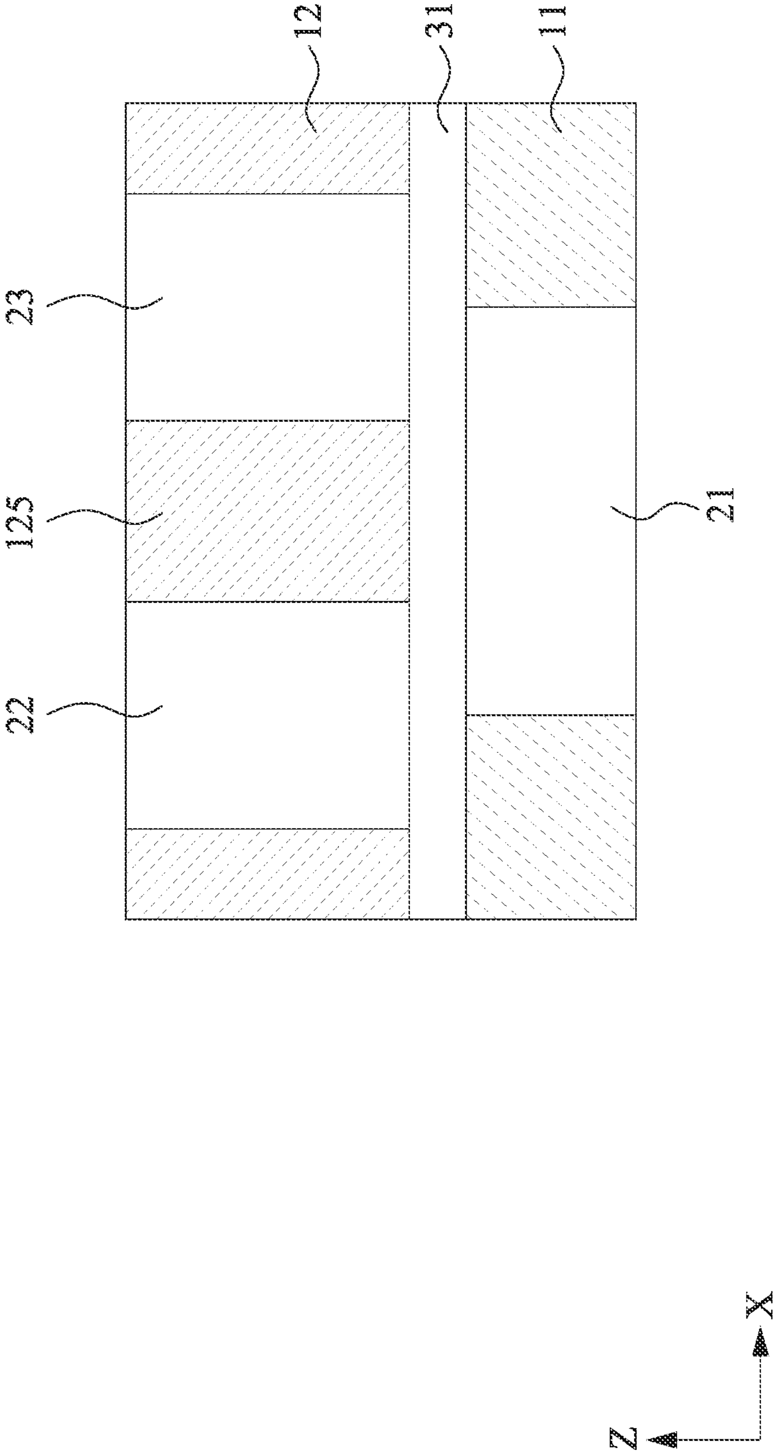

Referring to FIGS. 6A and 6B, which are schematic diagrams of a semiconductor structure at a stage of the method 700 in accordance with some embodiments of the present disclosure. In the operation 703, conductive lines 22 and 23 are formed in the openings 121 and 122. In some embodiments, a deposition is performed to form a conductive layer in the openings 121 and 122, and an etching-back operation is performed to remove portions of the conductive layer over the dielectric layer 12 until the dielectric layer 12 is exposed. The conductive lines 22 and 23 disposed in the openings 121 and 122 are thereby formed. In some embodiments, top surfaces of the conductive lines 22 and 23 are substantially coplanar with a top surface of the dielectric layer 12. The conductive lines 22 and 23 may function respectively as a source line and a bit line of a memory structure. In some embodiments, the conductive lines 22 and 23 are made of same materials. In some embodiments, each of the conductive lines 22 and 23 can include one or more metallic materials. In some embodiments, the metallic material includes titanium, titanium nitride, copper, tungsten, tantalum, tantalum nitride, other suitable conductive materials, or a combination thereof.

Figure 7A:
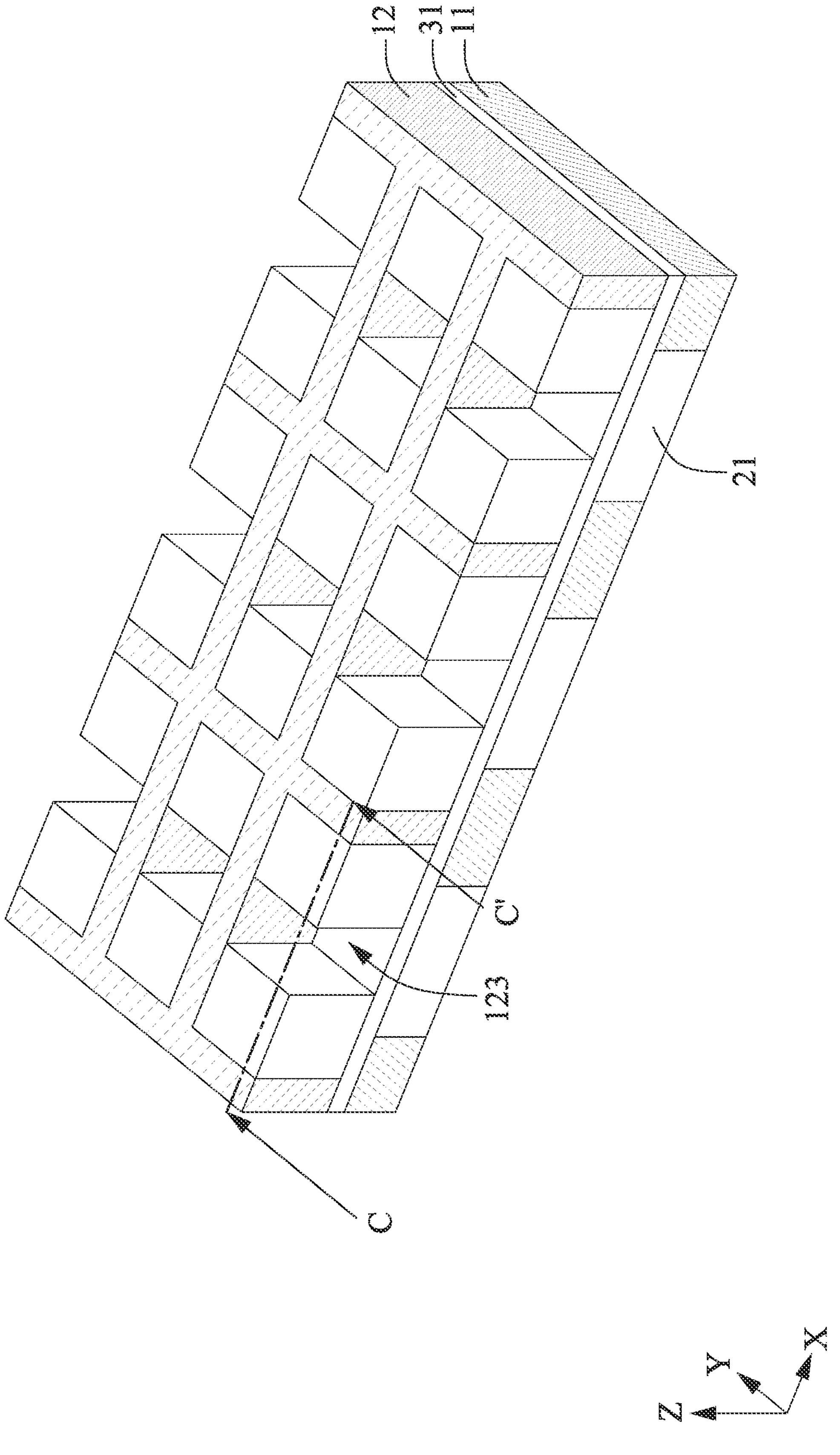
Figure 7B:
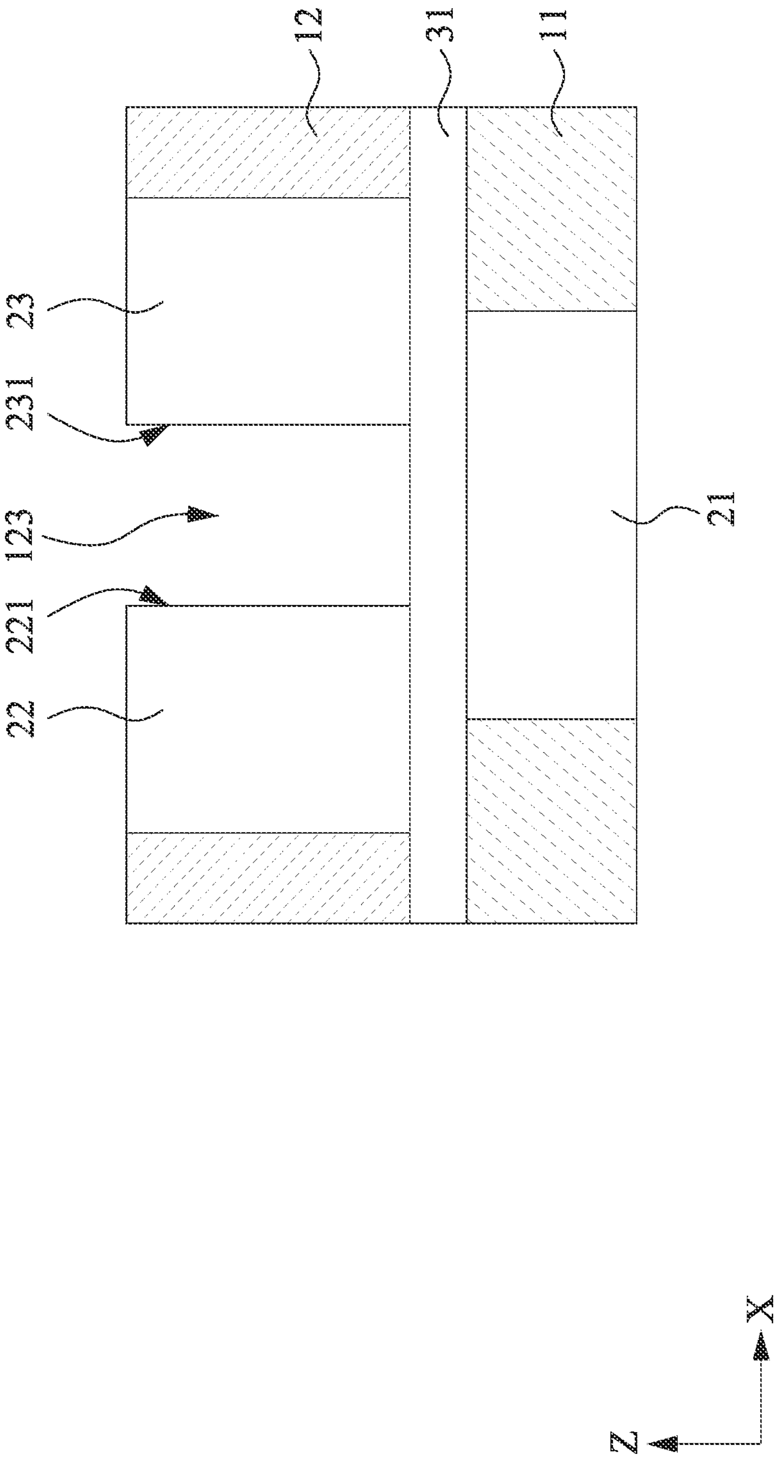

Referring to FIGS. 7A and 7B, which are schematic diagrams of a semiconductor structure at a stage of the method 700 in accordance with some embodiments of the present disclosure. In the operation 704, a portion 125 of the second dielectric layer 12 between the conductive lines 22 and 23 is removed. In some embodiments, a third opening 123 is thereby formed between the conductive lines 22 and 23. In some embodiments, a portion of the ferroelectric layer 31 is exposed by the opening 123 after the operation 704. In some embodiments, the portion of the ferroelectric layer 31 defines a bottom surface of the opening 123. In some embodiments, a sidewall 221 of the conductive line 22 proximal to the portion 125 of the dielectric layer 12 is exposed by the opening 123 after the operation 704. In some embodiments, at least a portion of the sidewall 221 of the conductive line 22 defines a sidewall of the opening 123. In some embodiments, a sidewall 231 of the conductive line 23 proximal to the portion 125 of the dielectric layer 12 is exposed by the opening 123 after the operation 704. In some embodiments, at least a portion of the sidewall 231 of the conductive line 23 defines a sidewall of the opening 123.

In some embodiments, an etching operation is performed to form the third opening 123. In some embodiments, an annealing operation is performed on the ferroelectric layer 31 to repair possible damage to the exposed portion of the ferroelectric layer 31 caused by the etching operation. In some embodiments, a temperature of the annealing operation is below 800 degrees Celsius (° C.). In some embodiments, the temperature of the annealing operation is in a range of 300 to 500° C.

Figure 8A:
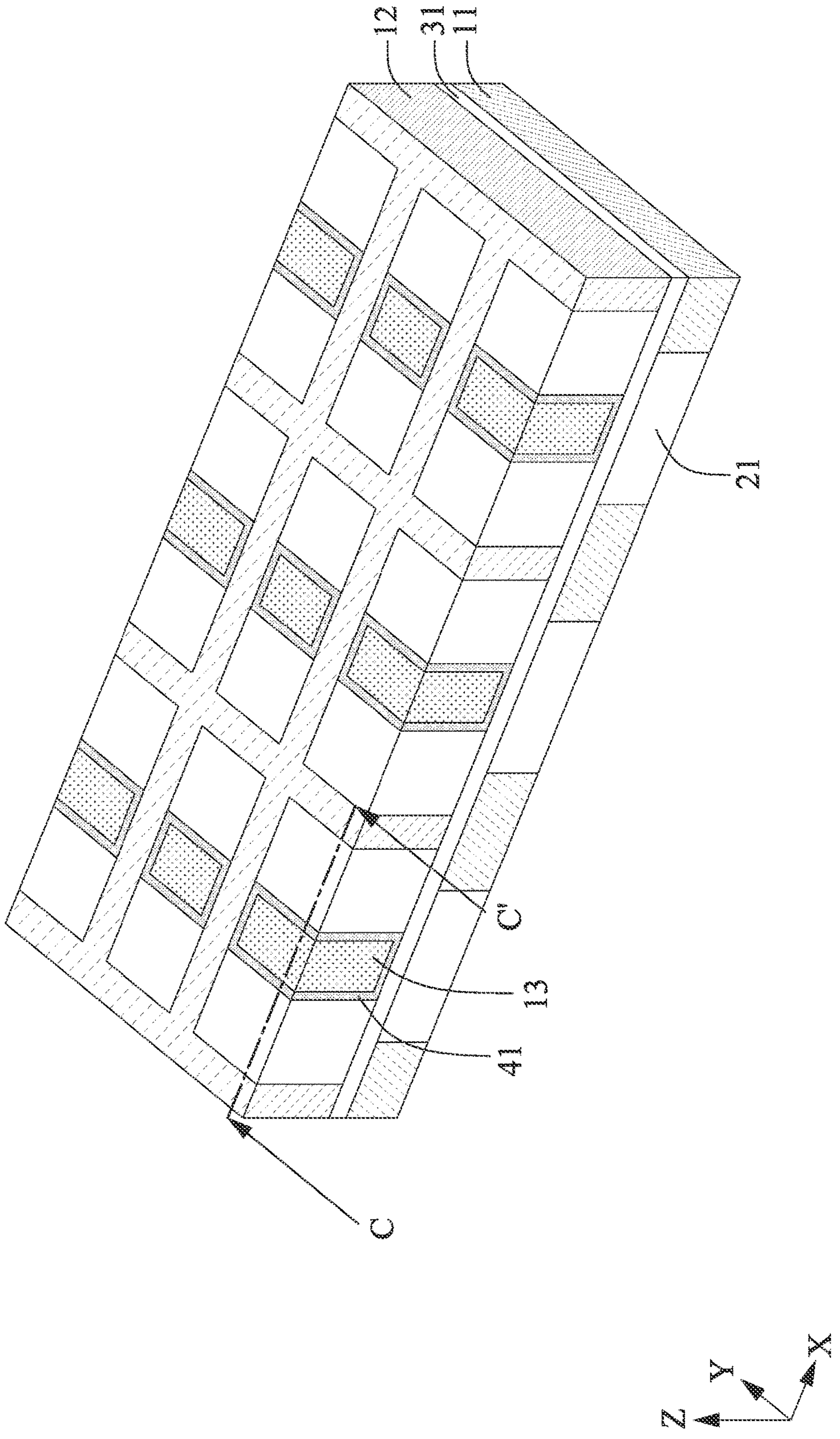
Figure 8B:
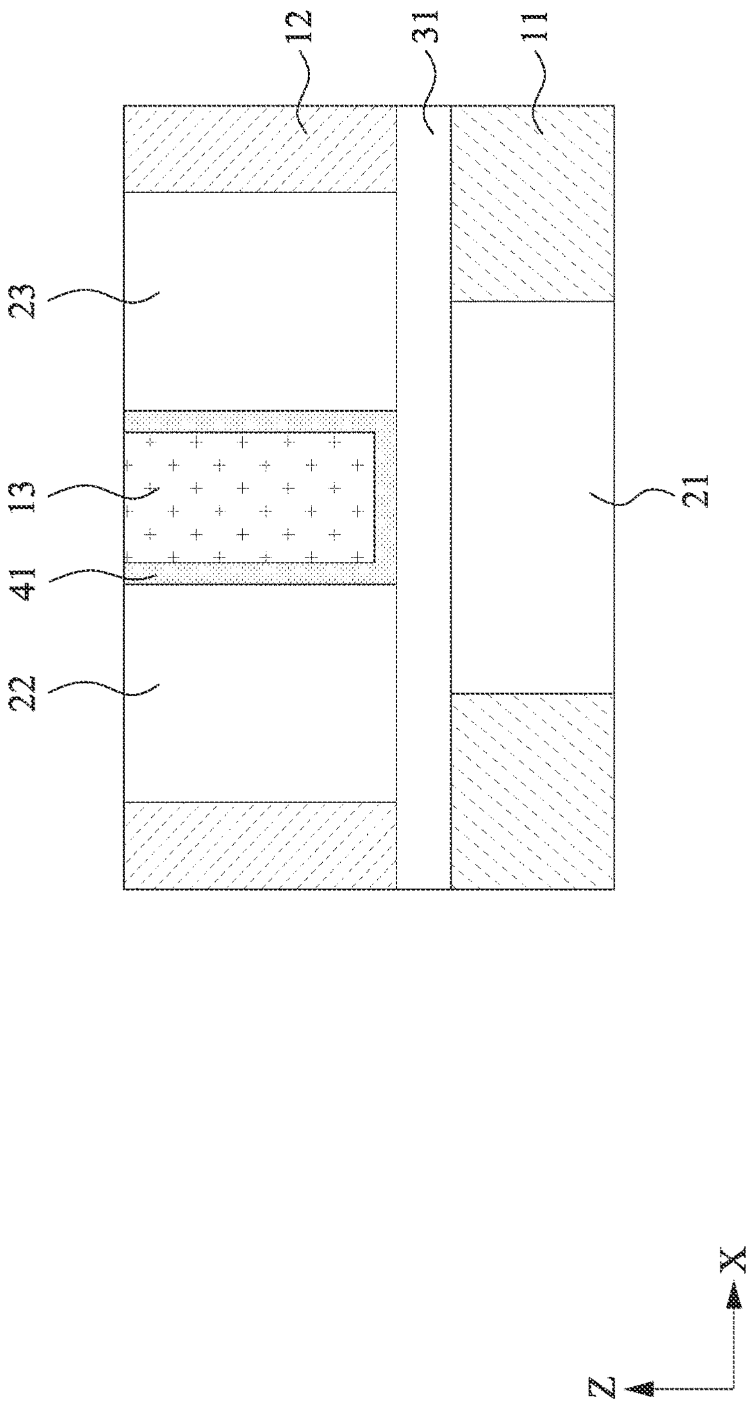

Referring to FIGS. 8A and 8B, which are schematic diagrams of a semiconductor structure at a stage of the method 700 in accordance with some embodiments of the present disclosure. In the operation 705, an oxide semiconductor layer 41 is formed in the third opening 123. In some embodiments, the oxide semiconductor layer 41 is formed by an atomic layer deposition (ALD) followed by an etching-back operation to remove oxide semiconductor material above the dielectric layer 12. In some embodiments, the dielectric layer 13 is in physical contact with the oxide semiconductor layer 41. In some embodiments, a material of the semiconductor layer 41 includes indium zinc oxide (IZO), indium tin oxide (ITO), indium oxide ($In_2O_3$), gallium oxide ($Ga_2O_3$), indium gallium zinc oxide (InGaZnO), zinc oxide (ZnO), aluminum zinc oxide ($Al_2O_5Zn_2$), aluminum doped zinc oxide (AZO), indium tungsten oxide (IWO), titanium oxide ($TiO_x$), semiconductor materials including III-V materials, alloys including a combination of above materials, or a combination thereof. In some embodiments, a thickness of the oxide semiconductor layer 41 is in a range of 1 to 50 nm. In some embodiments, the thickness of the oxide semiconductor layer 41 is in a range of 1 to 30 nm. In some embodiments, the thickness is substantially consistent across the oxide semiconductor layer 41.

In some embodiments, a profile of the oxide semiconductor layer 41 is conformal to a profile of the opening 123. The oxide semiconductor layer 41 is disposed over the ferroelectric layer, at least a portion of the sidewall 221 of the conductive line 22, and at least a portion of the sidewall 231 of the conductive line 23. In some embodiments, the oxide semiconductor layer 41 covers an entirety of the bottom surface of the opening 123. In some embodiments, the oxide semiconductor layer 41 covers an entirety of the exposed portion of the sidewall 221 of the conductive line 22. In some embodiments, the oxide semiconductor layer 41 covers an entirety of the exposed portion of the sidewall 231 of the conductive line 23. In some embodiments, the oxide semiconductor layer 41 at the top surface of the dielectric layer 12 is rectangular. However, the disclosure is not limited thereto. A configuration of the oxide semiconductor layer 41 from a top-view perspective depends on a configuration of the opening 123.

In the operation 706, a dielectric layer 13 is formed between the conductive lines 22 and 23 as shown in FIGS. 8A and 8B. In some embodiments, the dielectric layer 13 is formed by a deposition followed by an etching-back operation or a planarization (e.g., a chemical-mechanical planarization). A material of the dielectric layer 13 can be the same as or different from that of the dielectric layer 11 and/or that of the dielectric layer 12 . . . .

A memory structure 100 as shown in FIG. 8A having a memory unit 101 as shown in FIG. 8B is thereby formed. The memory unit 101 of the present disclosure includes the word line 21 functioning as a gate structure, the conductive lines 22 and 23 functioning as a source structure and a drain structure, the oxide semiconductor layer 41 functioning as a channel between the source and drain structures, and the ferroelectric layer 31 functioning as a binary switch.

Due to an electrical property of an oxide semiconductor material, it is common to use the oxide semiconductor material in advanced generations of semiconductor structures. However, research has shown that a ferroelectric material exhibits photovoltaic (P-V) behavior in an MFM (metal-ferroelectric-metal) structure that is better than a P-V behavior exhibited in an MFSM (metal-ferroelectric-semiconductor-metal) structure. In order to improve the P-V behavior of a ferroelectric random-access memory (FeRAM), the present disclosure provides a memory structure including an oxide semiconductor layer disposed between source/drain structures but absent between the source/drain structures and a gate structure of the memory structure. In addition, it has been found that hydrogen ions used or involved in many steps (e.g., deposition, etching, anneal, and thermal treatment) of a manufacturing process can diffuse into the oxide semiconductor layer and alter an operating voltage of a memory structure. The present disclosure provides a channel-last forming method in which the oxide semiconductor layer is formed after formation of the gate structure, the ferroelectric layer, and the source/drain structures in order to minimize diffusion of hydrogen ions into the oxide semiconductor structure during the manufacturing process. Therefore, performance of the memory structure of the FeRAM can be thereby improved.

Figure 9A:
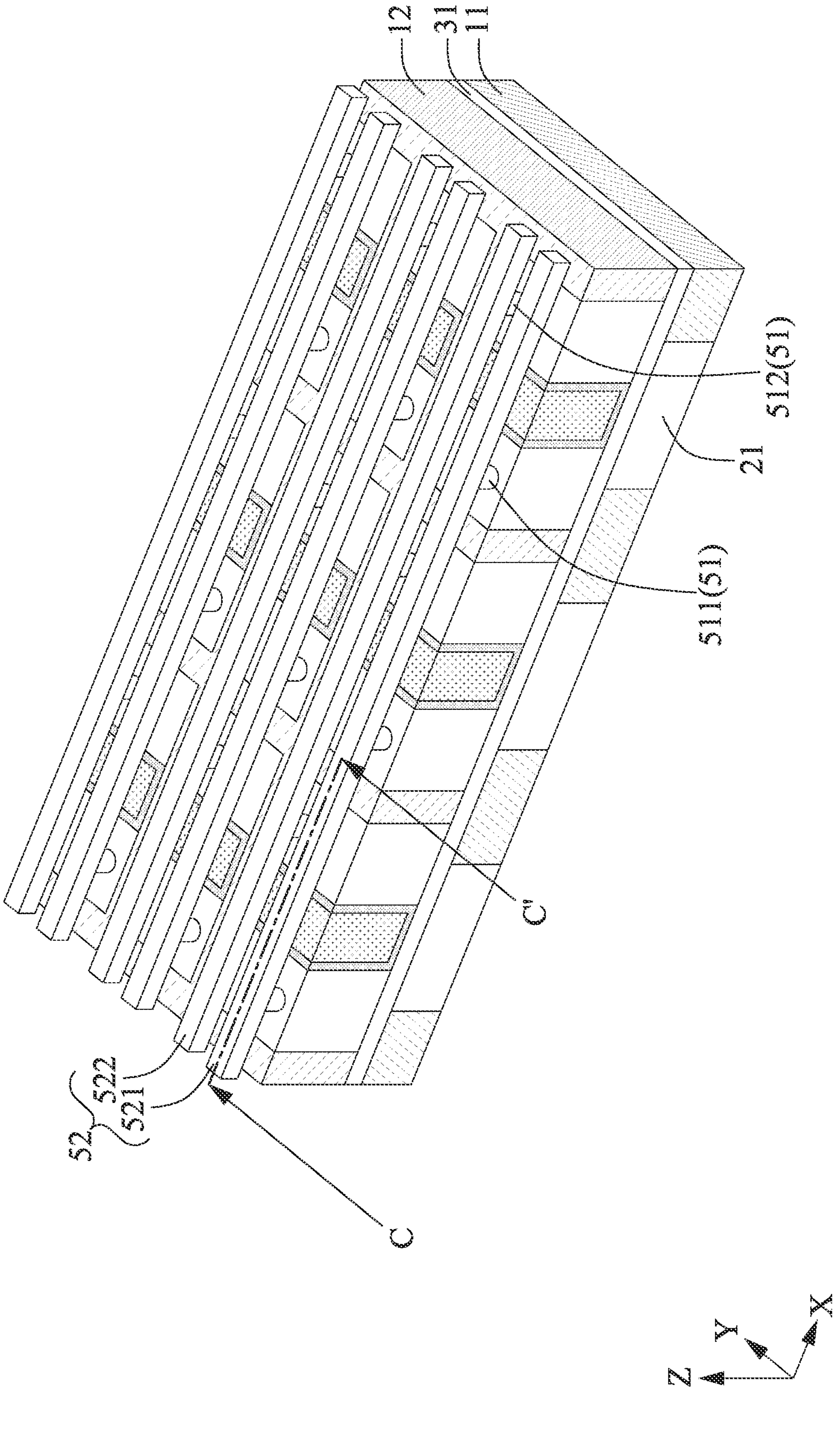
Figure 9B:
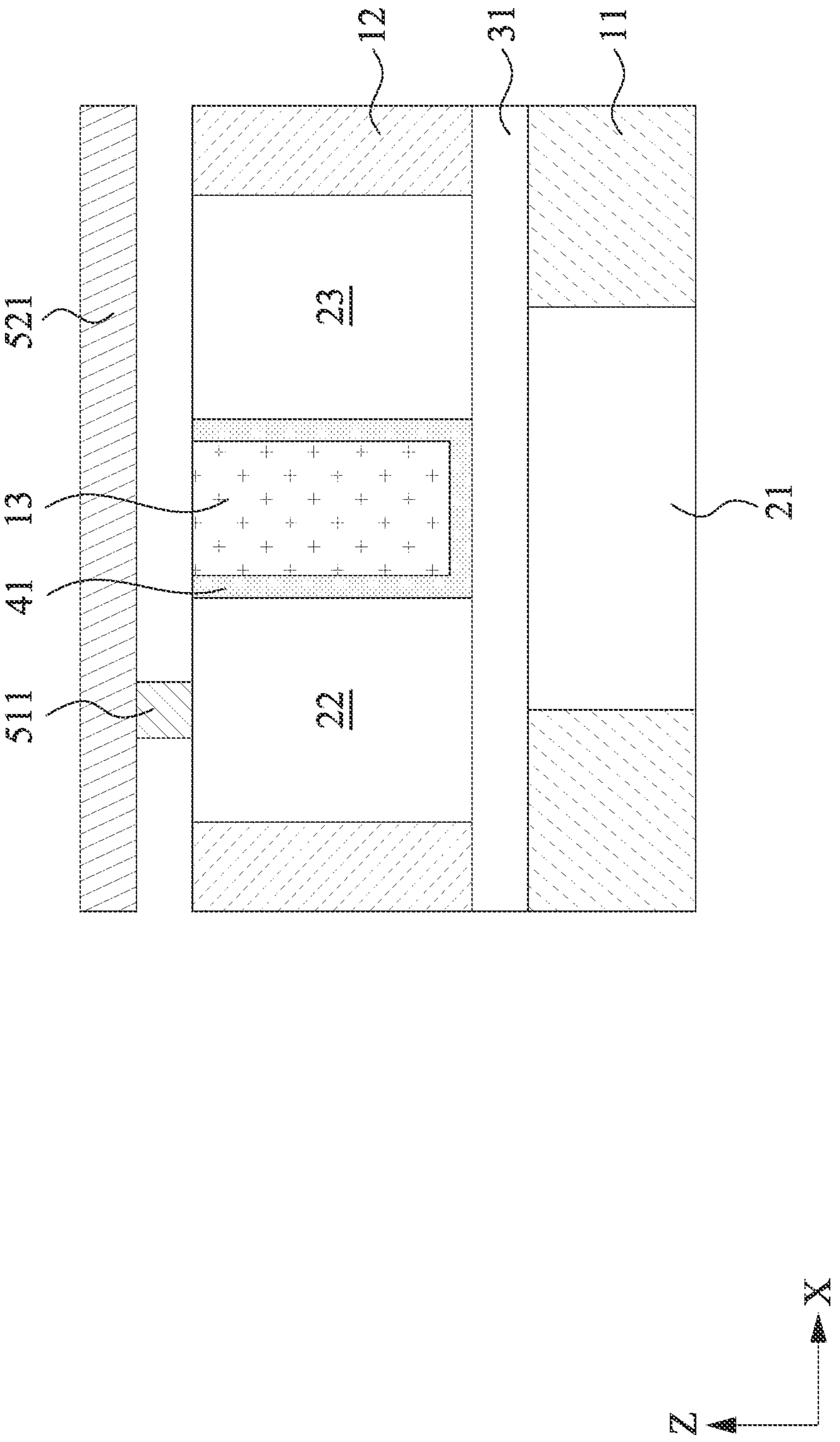

Referring to FIGS. 9A and 9B, which are schematic diagrams of a semiconductor structure at a stage of the method 700 in accordance with some embodiments of the present disclosure. After the operation 706, the method 700 may further include formation of metal vias 51 and metal lines 52 over the conductive lines 22 and 23. In some embodiments, the metal vias 51 include a plurality of metal vias 511 and a plurality of metal vias 512. In some embodiments, the metal vias 511 individually are connected to the conductive lines 22 among the memory structure 100. In some embodiments, the metal vias 512 individually are connected to the conductive lines 23 among the memory structure 100. In some embodiments, the metal lines 52 include a plurality of metal lines 521 and a plurality of metal lines 522. In some embodiments, each of the metal lines 521 extends along the first direction and is electrically connected to the conductive lines 22 (source structures) arranged along the first direction through the metal vias 511. In some embodiments, each of the metal lines 522 extends along the first direction and is electrically connected to the conductive lines 23 (drain structures) arranged along the first direction through the metal vias 512. In some embodiments, the metal vias 51 are formed concurrently with other vias of the interconnect structure at a same elevation. In some embodiments, the metal lines 52 are formed concurrently with other vias of the interconnect structure at a same elevation.

Figure 10:
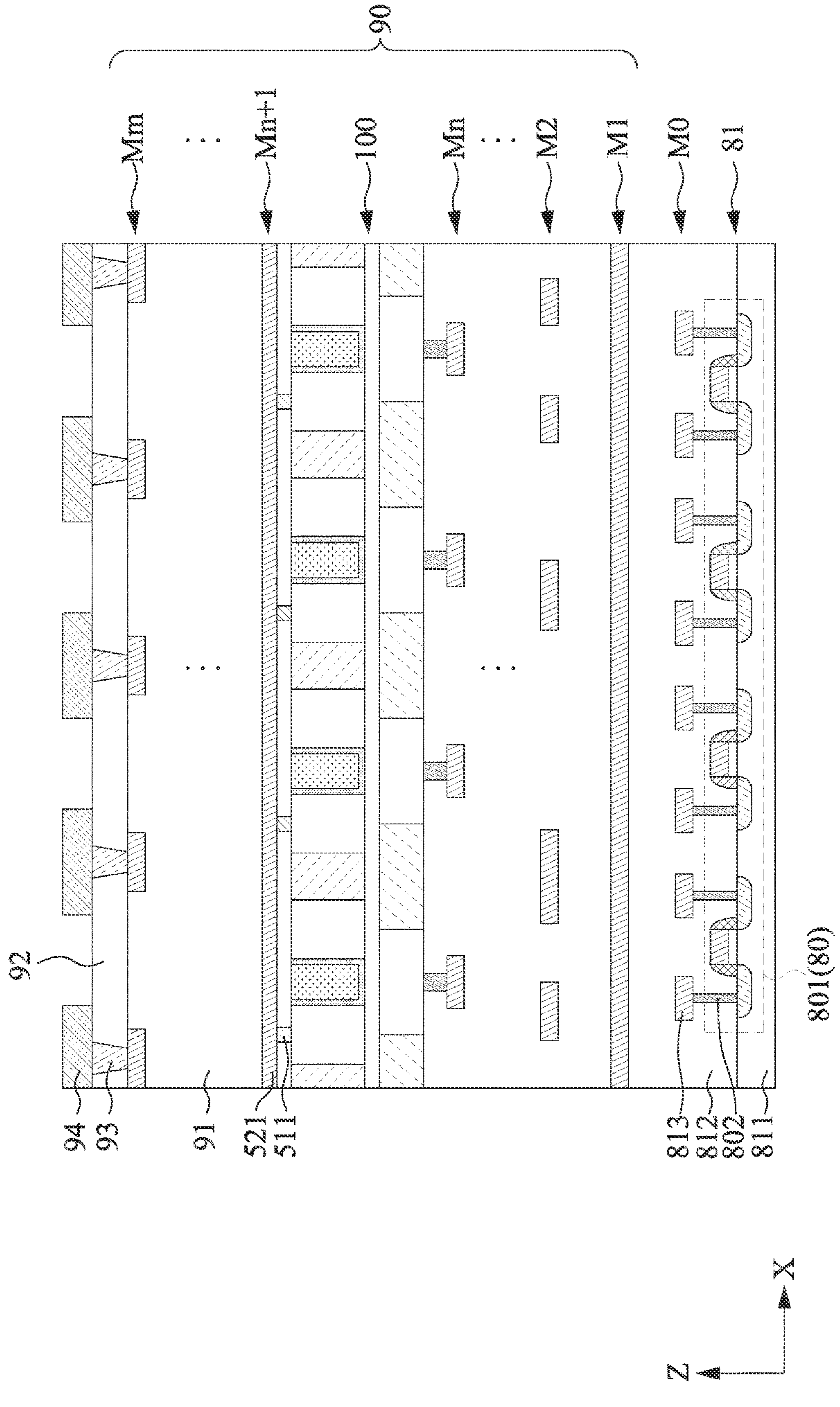
FIG. 10 is a schematic cross-sectional diagram of a semiconductor structure including a memory structure disposed in an interconnection structure over a logic device in accordance with some embodiments of the present disclosure.

FIG. 10 is a schematic cross-sectional diagram of the memory structure 100 (or multiple memory units 101) applied in an interconnection structure 90 over a logic device 80 in accordance with some embodiments of the present disclosure. In some embodiments, the logic device 80 is disposed in a substrate layer 81 and the interconnection structure 90 is disposed over the logic device 80. In some embodiments, the logic device 80 includes a plurality of transistors 801. In some embodiments, the substrate layer 81 includes a bulk substrate 811, and an insulating layer 812 formed on the bulk substrate 811 and covering the transistors 801. In some embodiments, the insulating layer 812 is a multi-layered structure. In some embodiments, the logic device 80 further includes a plurality of contacts 802 electrically connected to the plurality of transistors 801. The plurality of contacts 802 may provide electrical connection between source/drain regions and a metal line layer M0 disposed over the insulating layer 812. In some embodiments, the contacts 802 are electrically connected to corresponding metal lines 803 in the metal line layer M0. In some embodiments, the metal line layer M0 is a first metal line layer above the contacts 802. In some embodiments, the metal line layer M0 is a first metal line of the interconnection structure 90 over the substrate layer 81.

The interconnection structure 90 may include multiple metal line layers M0, M1, M2, . . . , Mn, Mn+1, . . . , and Mm, wherein n is a positive integer greater than 2, and m is a positive integer greater than n+1. In some embodiments, the metal line layer Mm represents a topmost metal line layer of the interconnect structure 90. In some embodiments, the memory structure 100 is disposed between the metal line layers Mn and Mn+1, wherein n is between 3 and 5. In some embodiments, the memory structure 100 is disposed between the metal line layers M4 and M5. In some embodiments, the memory structure 100 vertically overlaps at least one transistor 801 of the logic device 80. In some embodiments, the memory units 101 of the memory structure 100 are coupled to the metal line layers Mn and Mn+1. In some embodiments, the word lines 21 of the memory structure 100 are electrically coupled to the metal line layer Mn through metal vias disposed between the memory structure 100 and the metal line layer Mn. In some embodiments, the metal lines 521 and 522 shown in FIGS. 9A and 9B are disposed in the metal line layer Mn+1. The interconnection structure 90 may further include a plurality of metal via layers arranged alternately between the metal line layers for electrical connection between the metal line layers. In some embodiments, each metal line layer is formed of metal lines and an intermetal dielectric (IMD) 91 surrounding the metal lines. In some embodiments, each metal via layer is formed of metal vias and an IMD 91 surrounding the vias. In some embodiments, the IMD 91 is a multilayer structure.

In some embodiments, a passivation layer 92 is disposed over the interconnect structure 90. In some embodiments, the passivation layer 92 is formed by a deposition. A plurality of conductive pads 94 are formed over the passivation layer 92 and are electrically connected to the metal line layer Mm through a plurality of conductive vias 93. In some embodiments, the conductive pads 94 include aluminum. In some embodiments, the metal line layer Mn+1 is a second metal line layer from a top of the interconnect structure 90. In some embodiments, m equals n+2.

FIGS. 11 to 20 are schematic cross-sectional diagrams of semiconductor structures 201 to 210 similar to the memory unit 101 shown in FIG. 8B in accordance with different embodiments of the present disclosure. For ease of illustration, reference numerals with similar or same functions and properties are repeated in different embodiments and figures. For a purpose of brevity, in the following specification, only differences from the embodiments described above are emphasized, and descriptions of similar or same elements, functions, properties and/or processing are omitted.

Referring to FIG. 11, which is a schematic diagram of a semiconductor structure 201 (alternatively referred to as a memory unit 201) in accordance with some embodiments of the present disclosure. In some embodiments, the oxide semiconductor layer 41 is more likely to accumulate on the ferroelectric layer 31 than on the conductive lines 22 and 23 during the deposition of the oxide semiconductor layer 41. In other words, a deposition rate of an oxide semiconductor material of the oxide semiconductor layer 41 on the ferroelectric layer 31 is greater than a deposition rate of the oxide semiconductor material on the sidewall 221 of the conductive line and the sidewall 231 of the conductive line 23 shown in FIG. 7B. In some embodiments, a thickness 622 of a horizontal portion of the oxide semiconductor layer 41 is substantially greater than a thickness 621 of a vertical portion of the oxide semiconductor layer 41.

Figure 12:
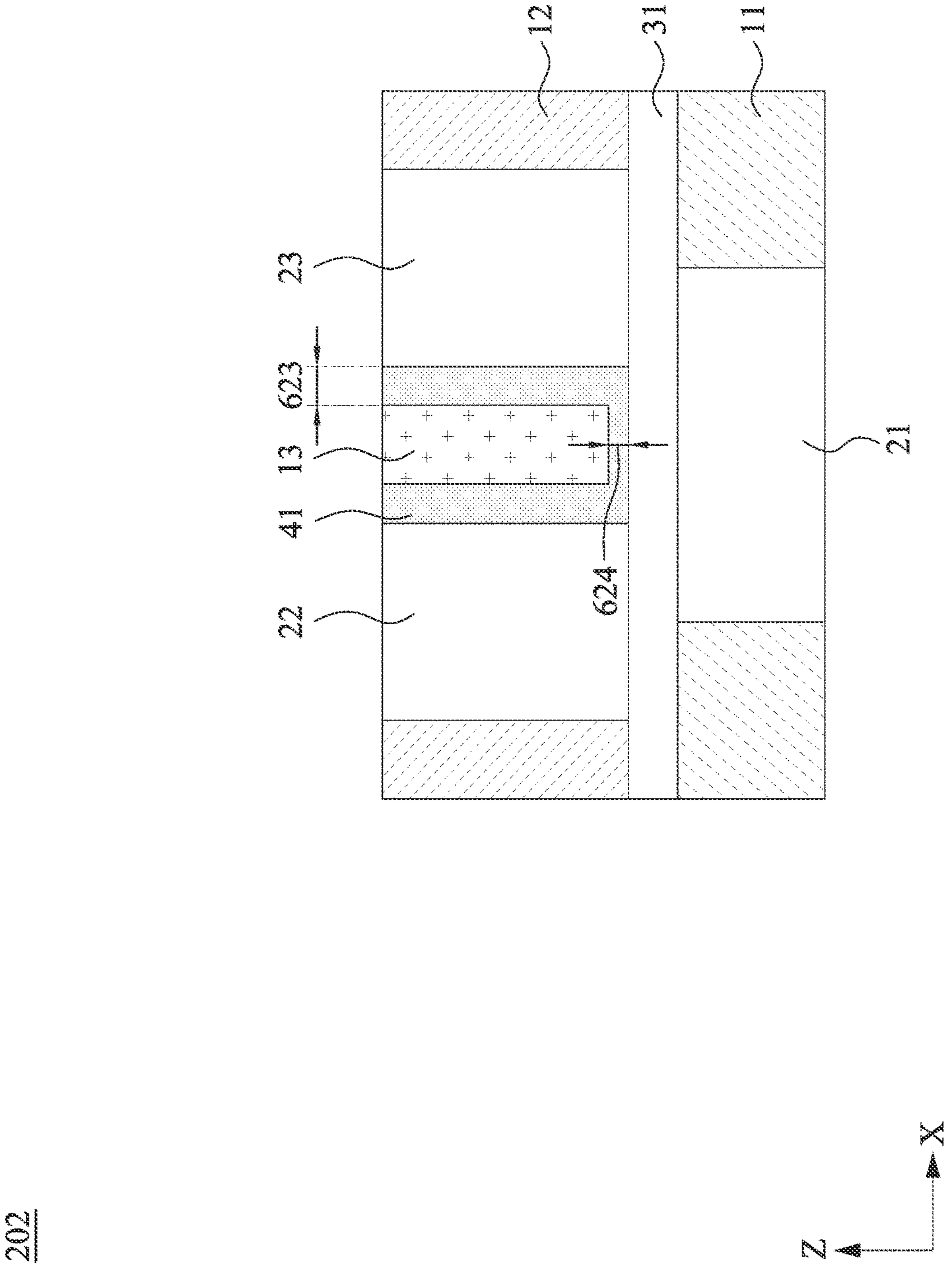

Referring to FIG. 12, which is a schematic diagram of a semiconductor structure 202 (alternatively referred to as a memory unit 202) in accordance with some embodiments of the present disclosure. In some embodiments, the oxide semiconductor layer 41 is more likely to accumulate on the conductive lines 22 and 23 than on the ferroelectric layer 31 during the deposition of the oxide semiconductor layer 41. In other words, a deposition rate of the oxide semiconductor material of the oxide semiconductor layer 41 on the ferroelectric layer 31 is less than a deposition rate of the oxide semiconductor material on the sidewall 221 of the conductive line and the sidewall 231 of the conductive line 23 shown in FIG. 7B. In some embodiments, a thickness 624 of a horizontal portion of the oxide semiconductor layer 41 is substantially less than a thickness 623 of a vertical portion of the oxide semiconductor layer 41.

Figure 13:
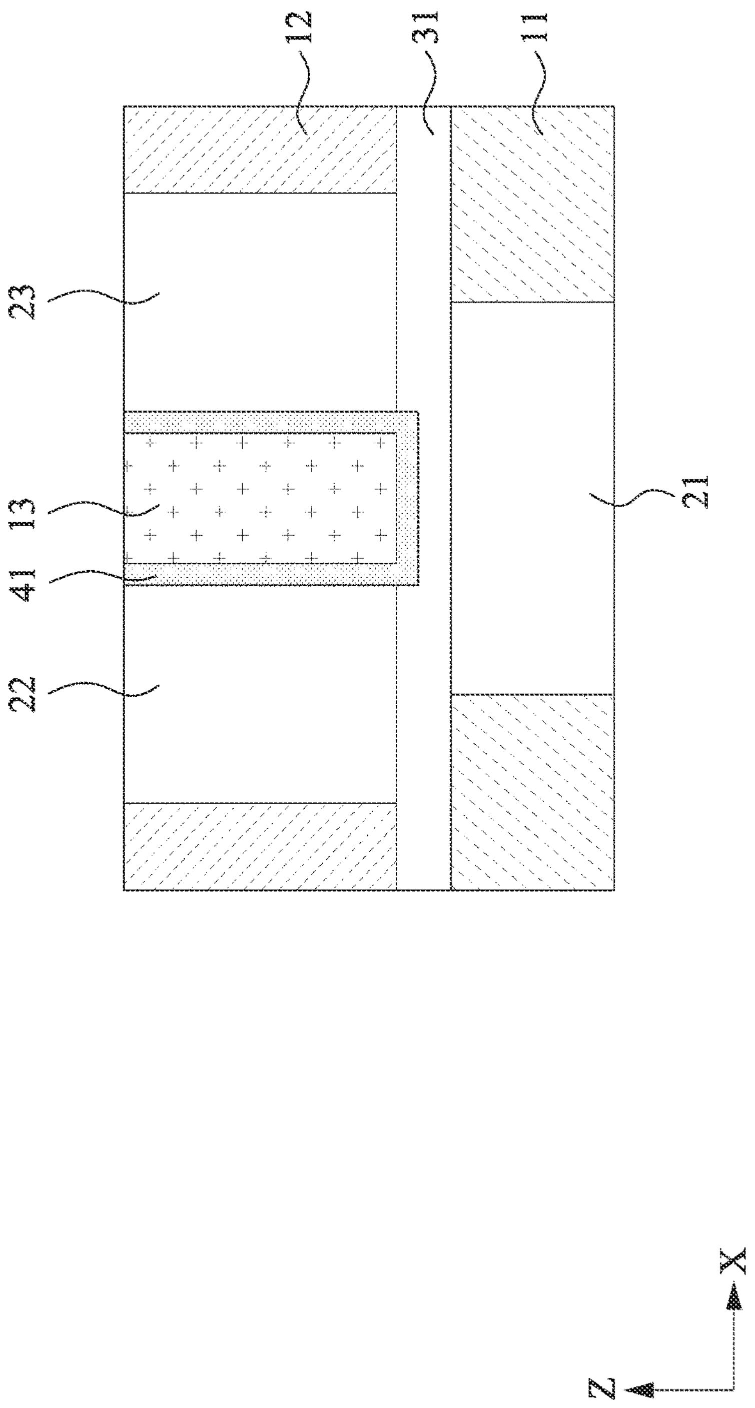

Referring to FIG. 13, which is a schematic diagram of a semiconductor structure 203 (alternatively referred to as a memory unit 203) in accordance with some embodiments of the present disclosure. In some embodiments, the ferroelectric layer 31 is over-etched by the etching operation for forming the opening 123 as shown in FIGS. 7A and 7B. In some embodiments, a surficial portion exposed in the opening 123 is removed by the etching operation. Therefore, in such embodiments, the oxide semiconductor layer 41 formed thereafter is partially below the dielectric layer 12. In some embodiments, the oxide semiconductor layer 41 is partially disposed in the ferroelectric layer 31. In some embodiments, a bottom of the oxide semiconductor layer 41 is surrounded by the ferroelectric layer 31.

Figure 14:
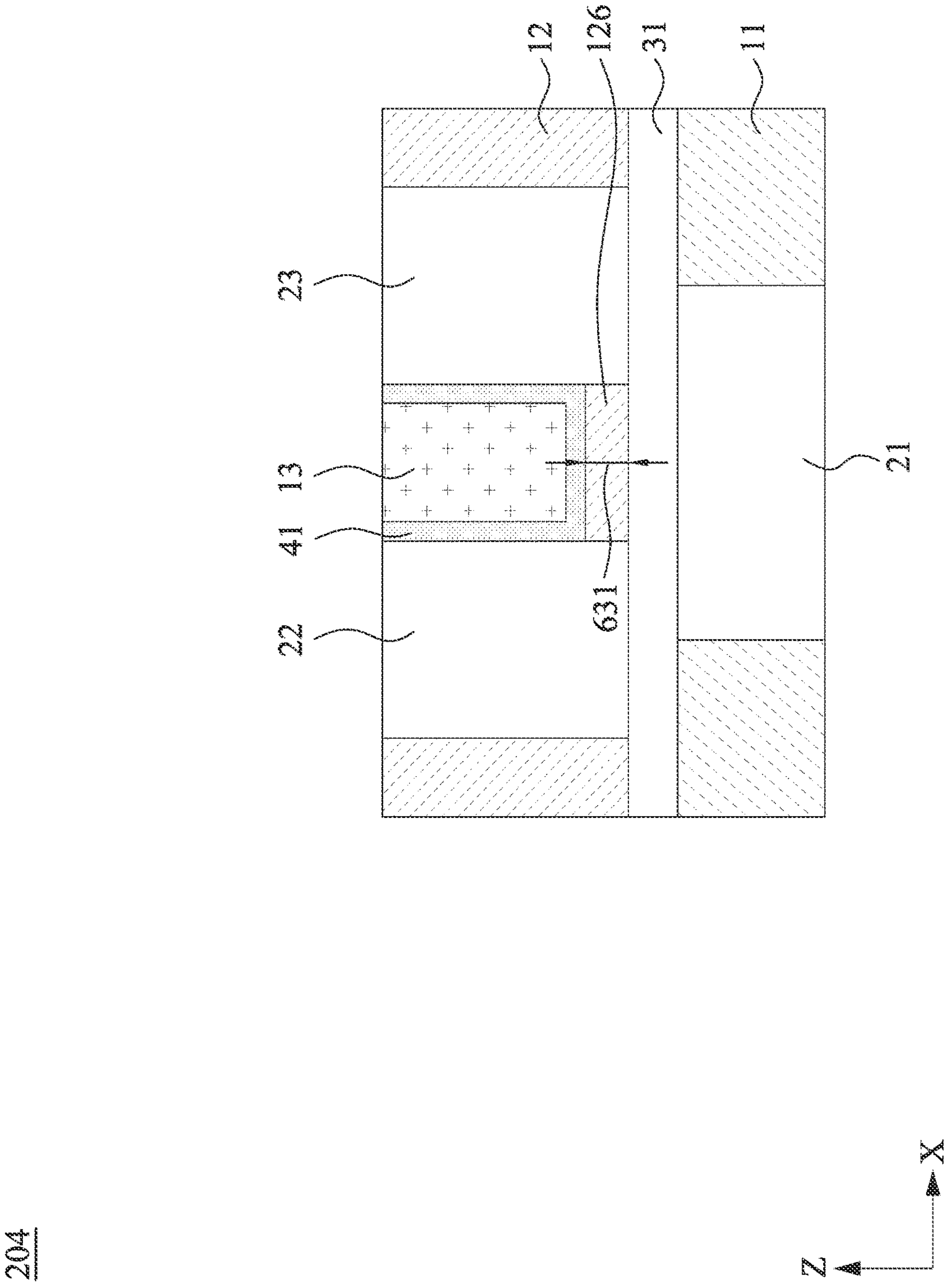

Referring to FIG. 14, which is a schematic diagram of a semiconductor structure 204 (alternatively referred to as a memory unit 204) in accordance with some embodiments of the present disclosure. In some embodiments, the portion 125 of the dielectric layer 12 is under-etched by the etching operation for forming the opening 123 as shown in FIGS. 7A and 7B. In some embodiments, a segment 126 of the portion 125 is left remaining at a bottom of the opening 123 shown in FIGS. 7A and 7B. Therefore, in such embodiments, the oxide semiconductor layer 41 formed thereafter is separated from the ferroelectric layer 41 by the segment 126 of the dielectric layer 12. In some embodiments, a thickness of the segment 126 is in a range of 1 to 10 nm.

Figure 15:
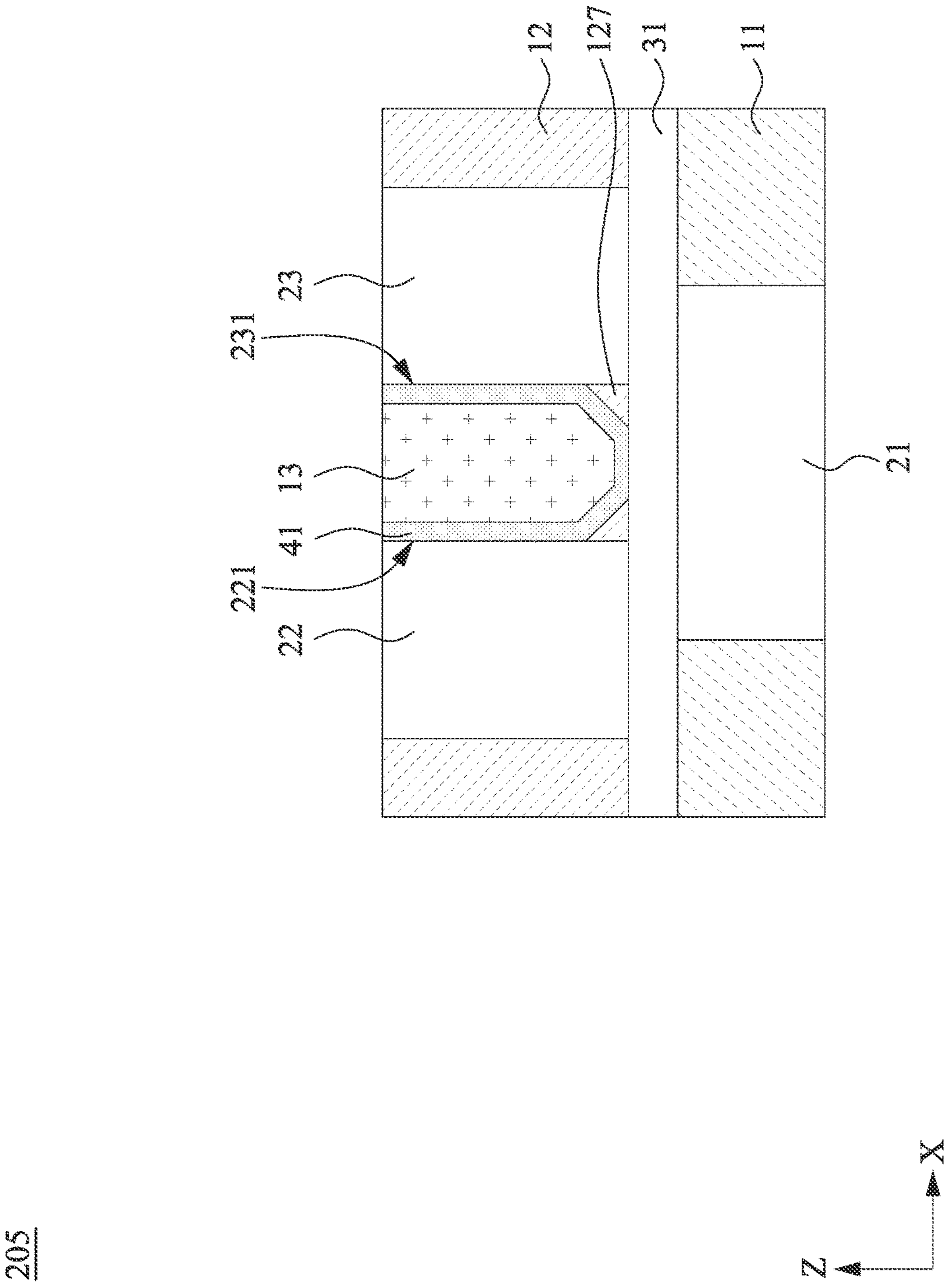

Referring to FIG. 15, which is a schematic diagram of a semiconductor structure 205 (alternatively referred to as a memory unit 205) in accordance with some embodiments of the present disclosure. In some embodiments, residues 127 of the portion 125 of the dielectric layer 12 remain at bottom corners of the opening 123 shown in FIGS. 7A and 7B. In some embodiments, the residues 127 of the portion 125 result in a narrower-bottom configuration of the opening 123. Therefore, in such embodiments, the oxide semiconductor layer 41 formed thereafter has a narrower-bottom configuration. In some embodiments, the oxide semiconductor layer 41 is in physical contact with an exposed portion of the ferroelectric layer 31 and the residues 127. In some embodiments, at least a portion of the sidewall 221 of the conductive line 22 covered by the residue 127 is separated from the oxide semiconductor layer 41. Similarly, in some embodiments, at least a portion of the sidewall 231 of the conductive line 23 covered by the residue 127 is separated from the oxide semiconductor layer 41.

Figure 16:
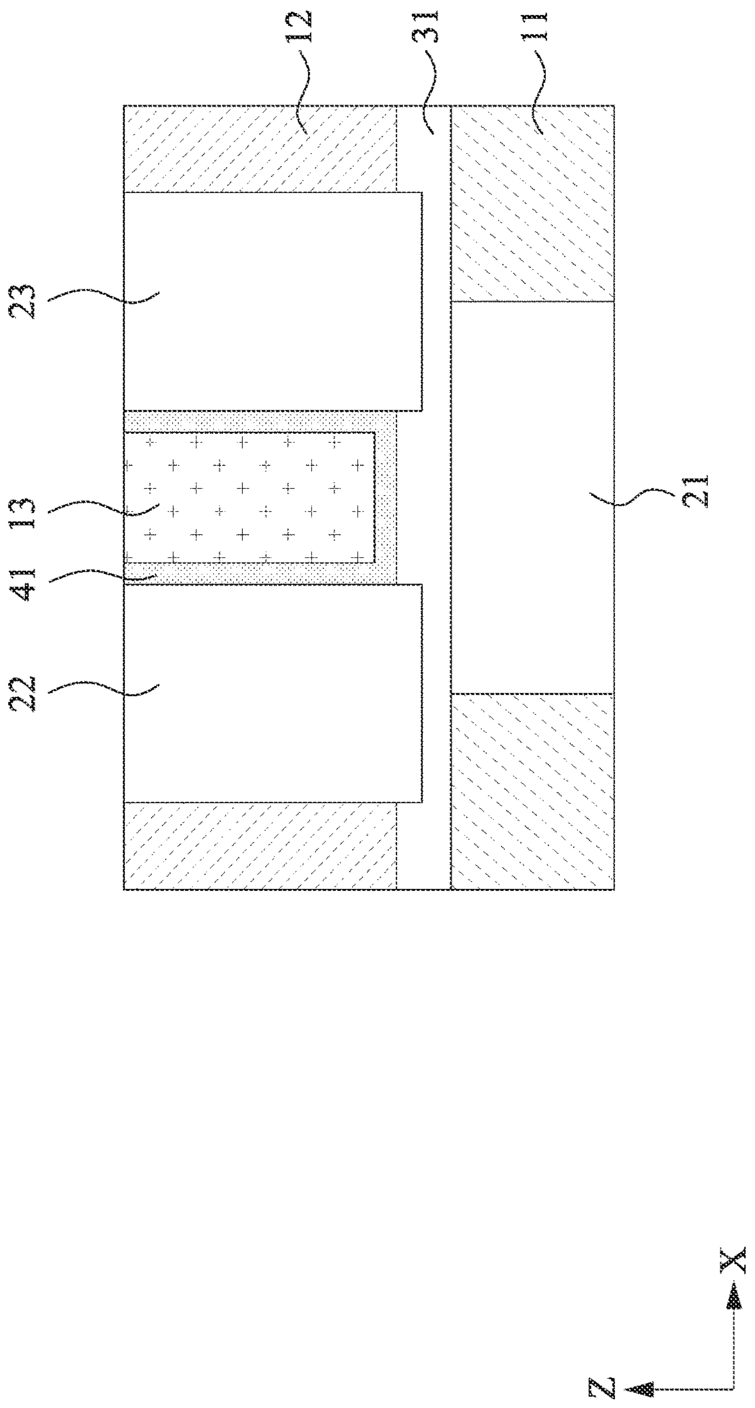

Referring to FIG. 16, which is a schematic diagram of a semiconductor structure 206 (alternatively referred to as a memory unit 206) in accordance with some embodiments of the present disclosure. In some embodiments, the ferroelectric layer 31 is over-etched by the etching operation for forming the openings 121 and 122 as shown in FIGS. 5A and 5B. In some embodiments, surficial portions exposed in at least one of the openings 121 and 122 are removed by the etching operation for forming the openings 121 and 122. Therefore, in such embodiments, at least one of the conductive lines 22 and 23 formed thereafter is partially below the dielectric layer 12. In some embodiments, at least one of the conductive lines 22 and 23 is partially disposed in the ferroelectric layer 31. In some embodiments, a bottom of the conductive lines 22 or 23 is surrounded by the ferroelectric layer 31.

Figure 17:
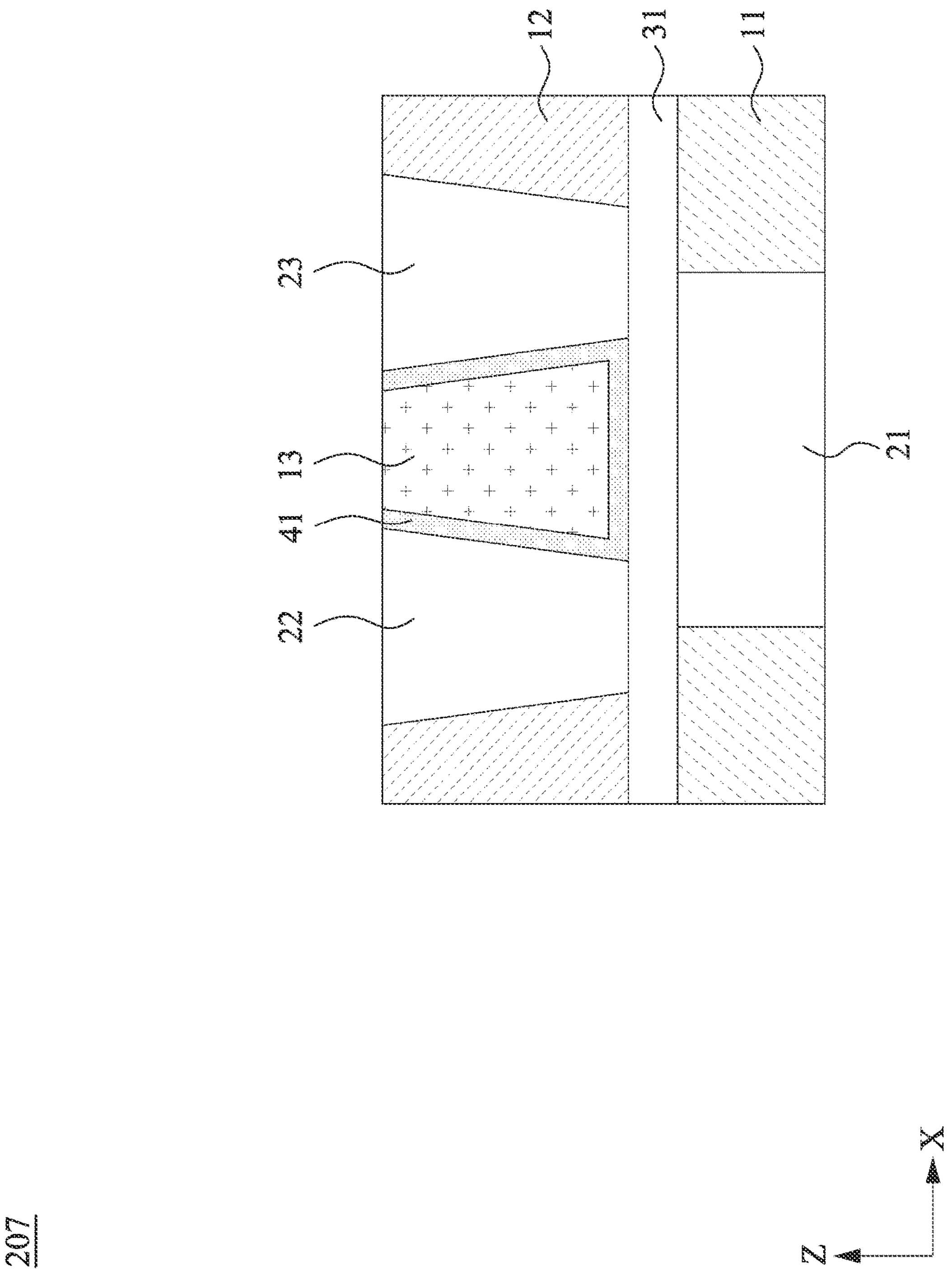

Referring to FIG. 17, which is a schematic diagram of a semiconductor structure 207 (alternatively referred to as a memory unit 207) in accordance with some embodiments of the present disclosure. Configurations of the openings 121 and 122 shown in FIGS. 5A and 5B depend on the etching operation as illustrated above. In some embodiments, sidewalls of the openings 121 and 122 are substantially perpendicular to an extending direction (the first direction) of the ferroelectric layer 31 as shown in FIGS. 5A and 5B. In some embodiments, each of the openings 121 and 122 is tapered toward the ferroelectric layer 31 as shown in FIG. 17. Therefore, in such embodiments, the oxide semiconductor layer 41 and the dielectric layer 13 are tapered from the ferroelectric layer 31. In some embodiments, the etching operation for removing the portion 125 as depicted in FIGS. 7A and 7B includes a directional etching operation followed by a pull-back etch on the portion 125, and the portion 125 can be entirely removed.

Figure 18:
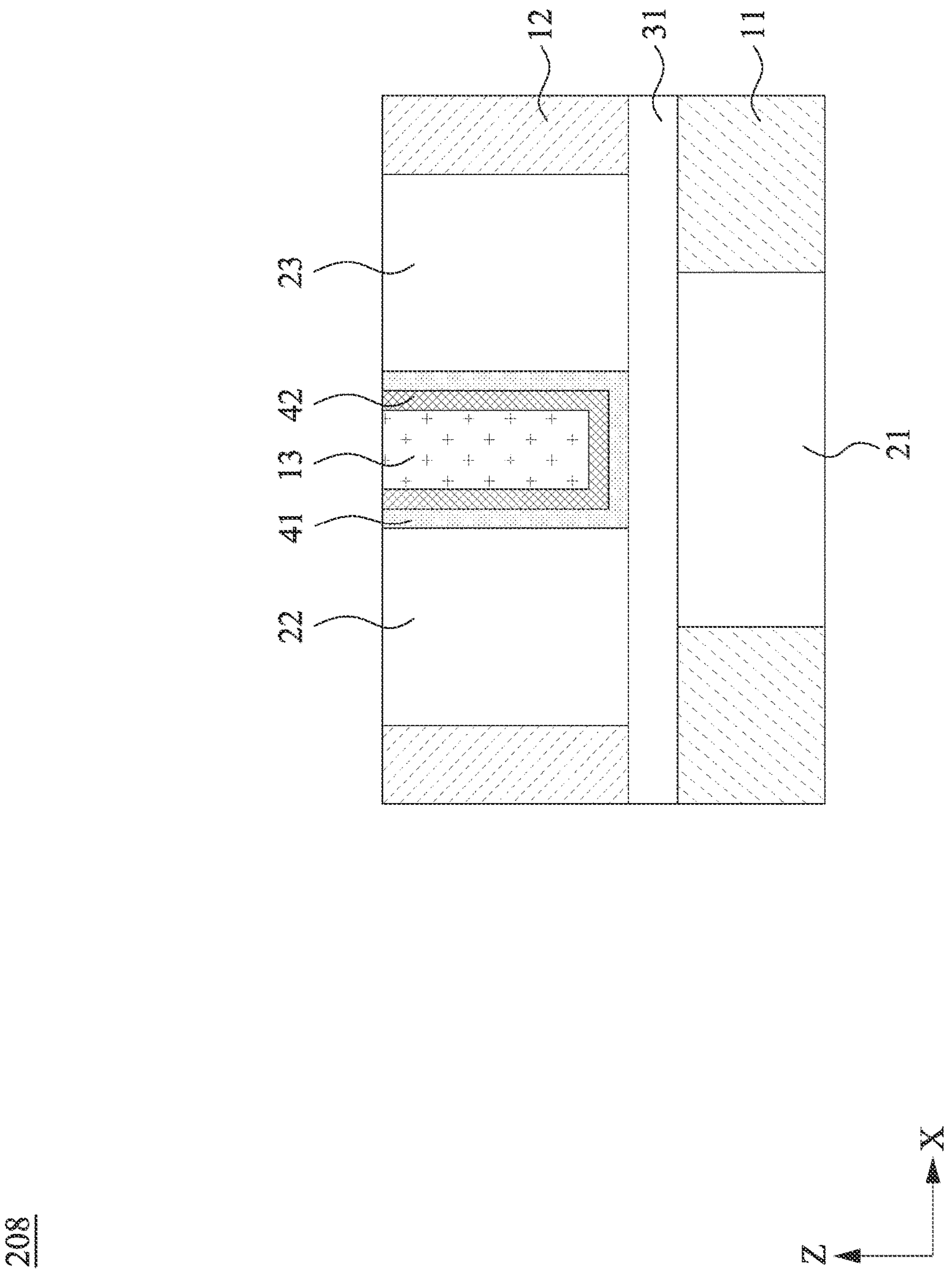

Referring to FIG. 18, which is a schematic diagram of a semiconductor structure 208 (alternatively referred to as a memory unit 208) in accordance with some embodiments of the present disclosure. In some embodiments, the method 700 further includes formation of a barrier layer 42 after the formation of the oxide semiconductor layer 41. In some embodiments, a deposition of a barrier material is performed after the formation of the oxide semiconductor 41 shown in FIGS. 8A and 8B. In some embodiments, the deposition of the barrier material can be similar to the deposition of the oxide semiconductor layer 41, and a profile of the barrier layer 42 thereby formed is conformal to a profile of the oxide semiconductor layer 41. In some embodiments, the barrier layer 42 is disposed between the oxide semiconductor layer 41 and the dielectric layer 13. In some embodiments, the barrier layer 42 surrounds the dielectric layer 13. In some embodiments, the barrier layer 42 can attract hydrogen ions from a processing environment to prevent diffusion of the hydrogen ions into the oxide semiconductor layer 41. In some embodiments, the barrier layer 42 can block hydrogen ions from diffusing into the oxide semiconductor layer 41. In some embodiments, the barrier layer 42 includes an oxide semiconductor material other than that of the oxide semiconductor layer 41. In some embodiments, the barrier layer 42 is referred to as a passivation layer 42.

Figure 19:
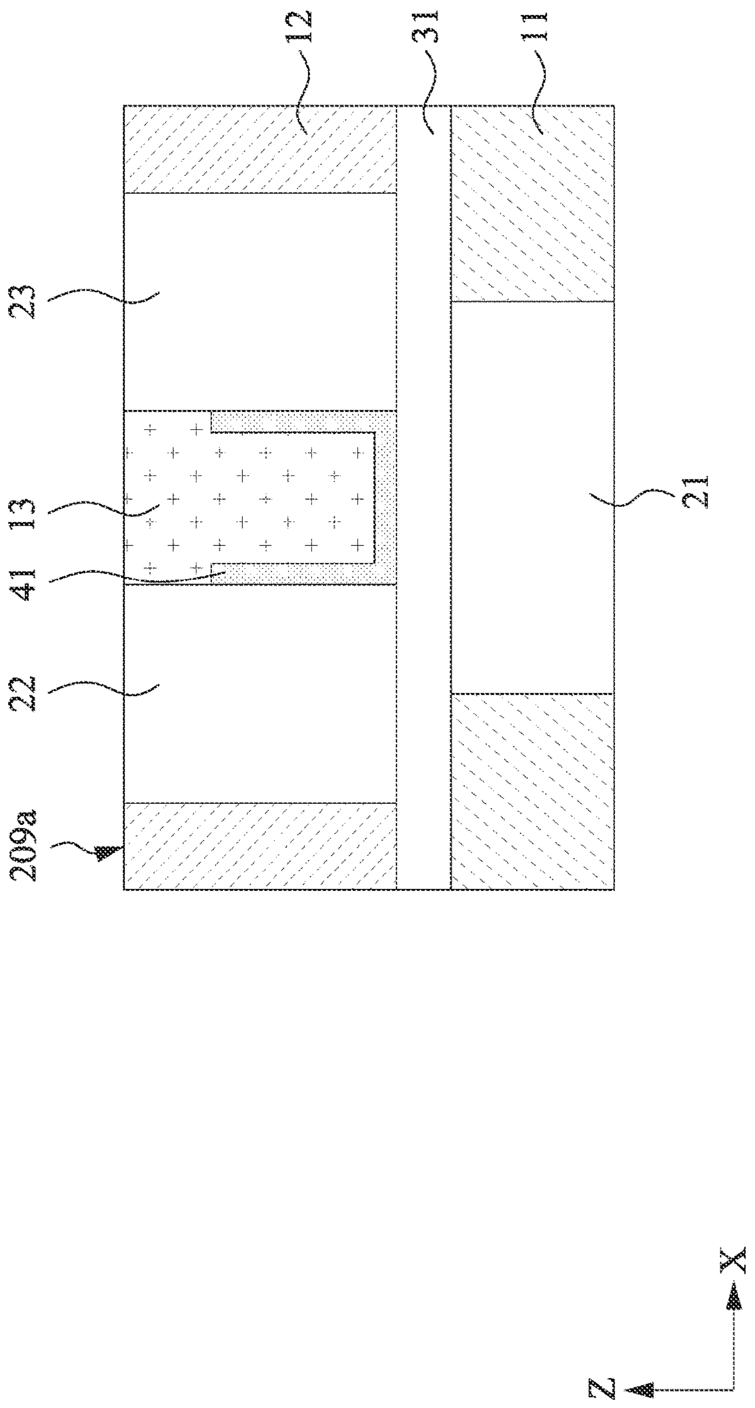

Referring to FIG. 19, which is a schematic diagram of a semiconductor structure 209 (alternatively referred to as a memory unit 209) in accordance with some embodiments of the present disclosure. In some embodiments, the oxide semiconductor layer 41 is over-etched by the etching-back operation for removing the oxide semiconductor material above the dielectric layer 12 as depicted in FIGS. 8A and 8B and described above. In some embodiments, a portion of the oxide semiconductor material lining upper portions of the sidewalls 221 and 231 of the conductive lines 22 and 23 is removed after the etching-back operation. In some embodiments, the dielectric layer 13 covers an entirety of the oxide semiconductor layer 41. In some embodiments, a portion of the dielectric layer 13 separates a top surface 209*a* of the semiconductor structure 209. Therefore, damage to the oxide semiconductor layer 41 by an etching solution of a planarization (e.g., the planarization performed during the formation of the dielectric layer 13 or a polishing operation at other stages of the method 700) can be prevented.

Figure 20:
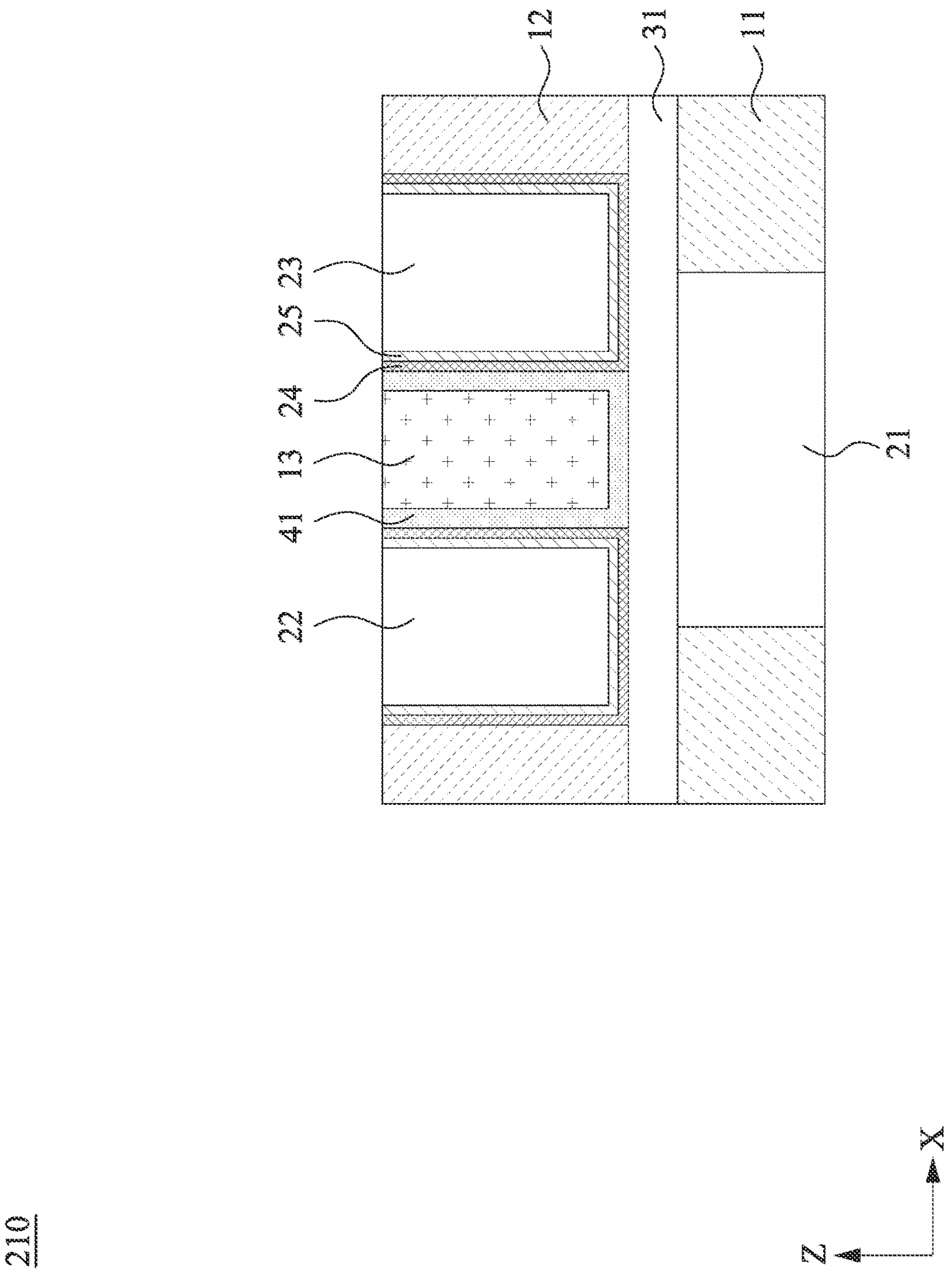

Referring to FIG. 20, which is a schematic diagram of a semiconductor structure 210 (alternatively referred to as a memory unit 210) in accordance with some embodiments of the present disclosure. In some embodiments, the method 700 further includes formation of an ohmic contact layer 24 and an adhesion layer 25 after the formation of the conductive lines 22 and 23. In some embodiments, depositions of an ohmic contact material and an adhesion material are sequentially performed after the formation of the openings 121 and 122 shown in FIGS. 5A and 5B. In some embodiments, an etching-back operation is performed on the ohmic contact material and the adhesion material until the dielectric layer 12 is exposed, thereby forming the ohmic contact layer 24 and the adhesion layer 25.

In some embodiments, the depositions of the ohmic contact material and the adhesion material include ALD. In some embodiments, the ohmic contact layer 24 is formed prior to the adhesion layer 25. In some embodiments, the adhesion layer 25 is disposed between and separates the ohmic contact layer 24 and the conductive lines 22 and 23. In some embodiments, the ohmic contact layer 24 surrounds or lines the conductive lines 22 and 23. In some embodiments, the adhesion layer 25 surrounds or lines the conductive lines 22 and 23. In some embodiments, a thickness of the ohmic contact layer 24 is less than the thickness of the oxide semiconductor layer 41. In some embodiments, the thickness of the ohmic contact layer 24 is about ⅕ of the thickness of the oxide semiconductor layer 41. In some embodiments, the thickness of the ohmic contact layer 24 is in a range of 1 to 10 nm. In some embodiments, a thickness of the adhesion layer 25 is greater than the thickness of the ohmic contact layer 24. In some embodiments, the thickness of the adhesion layer 25 is less than the thickness of the oxide semiconductor layer 41. In some embodiments, the thickness of the adhesion layer 25 is in a range of 1 to 10 nm.

In accordance with some embodiments of the disclosure, a semiconductor structure is provided. The semiconductor structure includes a gate structure, disposed over a substrate; a ferroelectric material, disposed over the gate structure; a source structure and a drain structure, disposed above the ferroelectric material; an isolation, surrounding the source structure and the drain structure; and an oxide semiconductor, surrounding a portion of the isolation between the source structure and the drain structure.

In accordance with some embodiments of the disclosure, a semiconductor structure is provided. The semiconductor structure includes a first channel layer surrounding a first portion of a dielectric layer disposed between a first source line and a first bit line; a ferroelectric layer, overlapped by the first channel layer, the first source line and the first bit line; and a first word line, disposed below the first ferroelectric layer.

In accordance with some embodiments of the disclosure, a method for manufacturing a semiconductor structure is provided. The method 700 includes a number of operations. A word line is formed in a first dielectric layer over a substrate. A ferroelectric layer is formed over the first dielectric layer. A source line and a bit line are formed over the ferroelectric layer in a second dielectric layer. A portion of the second dielectric layer between the source line and the bit line is removed. A first oxide semiconductor layer is formed over the ferroelectric layer and sidewalls of the source line and the bit line. A third dielectric layer is formed between the source line and the bit line.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory structure, comprising:
- a gate structure, disposed over a substrate;
- a ferroelectric material, disposed over the gate structure;
- a source structure and a drain structure, respectively disposed above and in contact with the ferroelectric material;
- an isolation, surrounding the source structure and the drain structure and comprising a first portion and a second portion, wherein a lowest bottom surface of the first portion is aligned with a lowest bottom surface of the second portion; and
- an oxide semiconductor, wherein the source structure includes a first sidewall and the drain structure includes a second sidewall, wherein the first sidewall and the second sidewall are in contact with the oxide semiconductor and covered by the oxide semiconductor.

2. The memory structure of claim 1, wherein the memory structure is disposed in an interconnect structure vertically overlapping a logic device.

3. The memory structure of claim 1, wherein a thickness of a horizontal portion of the oxide semiconductor is the same as a thickness of a vertical portion of the oxide semiconductor.

4. The memory structure of claim 1, wherein the lowest bottom surface of the first portion of the isolation is respectively coplanar with a bottom surface of the source structure and a bottom surface of the drain structure.

5. The memory structure of claim 1, wherein the oxide semiconductor is disposed on the ferroelectric material.

6. The memory structure of claim 1, wherein the oxide semiconductor is in physical contact with the ferroelectric material.

7. A semiconductor structure, comprising:
- a first channel layer surrounding a first portion of a dielectric layer disposed between a first source line and a first bit line;
- a ferroelectric layer, overlapped by the first channel layer, the first source line and the first bit line, wherein the first source line and the first bit line are respectively disposed above and in contact with the ferroelectric layer;
- an isolation, surrounding the first source line and the first bit line and comprising a first portion and a second portion, wherein a lowest bottom surface of the first portion is aligned with a lowest bottom surface of the second portion; and
- a first word line, disposed below the first ferroelectric layer, wherein the first source line includes a first sidewall and the first bit line includes a second sidewall, wherein the first sidewall and the second sidewall are in contact with the first channel layer and covered by the first channel layer.

8. The semiconductor structure of claim 7, wherein the first word line is overlapped by the first source line and the first bit line.

9. The semiconductor structure of claim 7, wherein the first channel layer encircles the dielectric layer from a top-view perspective.

10. The semiconductor structure of claim 7, further comprising:
- a second channel layer surrounding a second portion of the dielectric layer disposed between a second source line and a second bit line, wherein the second channel layer, the second source line and the second bit line vertically overlap the ferroelectric layer; and
- a second word line, overlapped by the second source line and the second bit line.

11. The semiconductor structure of claim 10, wherein a portion of the first channel layer is disposed on the ferroelectric layer.

12. The semiconductor structure of claim 7, wherein a thickness of the first channel layer is in a range of 1 to 50 nanometers, and a thickness of the ferroelectric layer is in a range of 1 to 50 nanometers.

13. The semiconductor structure of claim 7, wherein a distance between the first source line and the first bit line is in a range of 10 to 100 nanometers.

14. The semiconductor structure of claim 7, wherein the first channel layer is in physical contact with the ferroelectric material.

15. A memory structure, comprising:
- a gate structure, disposed over a substrate;
- a ferroelectric material, disposed over the gate structure;

a source structure and a drain structure, respectively disposed above and in contact with the ferroelectric material;

an isolation, surrounding the source structure and the drain structure, wherein the isolation comprises a first portion and a second portion; and an oxide semiconductor, wherein a lowest bottom surface of the first portion is aligned with a lowest bottom surface of the second portion, wherein the lowest bottom surface of the first portion is respectively coplanar with a bottom surface of the source structure and a bottom surface of the drain structure, and wherein the source structure includes a first sidewall and the drain structure includes a second sidewall, wherein the first sidewall and the second sidewall are in contact with the oxide semiconductor and covered by the oxide semiconductor.

16. The memory structure of claim 15, wherein the oxide semiconductor is in physical contact with the ferroelectric material.

17. The memory structure of claim 16, wherein the portion of the oxide semiconductor is disposed on the ferroelectric material.

18. The memory structure of claim 15, wherein a material of the oxide semiconductor includes one of indium zinc oxide (IZO), indium tin oxide (ITO), indium oxide ($In_2O_3$), gallium oxide ($Ga_2O_3$), indium gallium zinc oxide (InGaZnO), zinc oxide (ZnO), aluminum zinc oxide ($Al_2O_5Zn_2$), aluminum doped zinc oxide (AZO), indium tungsten oxide (IWO), titanium oxide ($TiO_x$), or a combination thereof.

19. The memory structure of claim 15, wherein a material of the first portion is different than a material of the second portion.

20. The memory structure of claim 15, wherein the memory structure is disposed in an interconnect structure vertically overlapping a logic device.

* * * * *